US009112409B2

(12) United States Patent
Li et al.

(10) Patent No.: US 9,112,409 B2
(45) Date of Patent: Aug. 18, 2015

(54) SWITCHED MODE ASSISTED LINEAR REGULATOR WITH DYNAMIC BUCK TURN-OFF USING ZCD-CONTROLLED TUB SWITCHING

(71) Applicant: Texas Instruments Incorporated, Dallas, TX (US)

(72) Inventors: Yushan Li, Berthoud, CO (US); Kevin Vannorsdel, Erie, CO (US); Steven K. Berg, Littleton, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/586,151

(22) Filed: Dec. 30, 2014

(65) Prior Publication Data

US 2015/0155783 A1    Jun. 4, 2015

Related U.S. Application Data

(63) Continuation-in-part of application No. 13/963,355, filed on Aug. 9, 2013.

(60) Provisional application No. 61/681,901, filed on Aug. 10, 2012.

(51) Int. Cl.
  *H02M 3/158*    (2006.01)
(52) U.S. Cl.
  CPC ..................................... *H02M 3/158* (2013.01)
(58) Field of Classification Search
  CPC ...................... H02M 5/293; H02M 2001/0045
  See application file for complete search history.

(56) References Cited

U.S. PATENT DOCUMENTS

| | | | | |
|---|---|---|---|---|
| 5,477,481 A | * | 12/1995 | Kerth | 708/819 |
| 6,813,173 B2 | * | 11/2004 | Lipcsei | 363/98 |
| 7,190,150 B2 | * | 3/2007 | Chen et al. | 323/222 |
| 7,495,423 B1 | * | 2/2009 | Knight et al. | 323/284 |
| 7,679,433 B1 | * | 3/2010 | Li | 330/10 |
| 7,872,883 B1 | * | 1/2011 | Elbanhawy | 363/25 |
| 8,063,617 B2 | * | 11/2011 | Wang et al. | 323/272 |
| 8,373,397 B2 | * | 2/2013 | Tanifuji et al. | 323/271 |
| 8,665,018 B2 | * | 3/2014 | Strange et al. | 330/136 |
| 8,723,500 B2 | * | 5/2014 | Houston et al. | 323/285 |
| 8,803,605 B2 | * | 8/2014 | Fowers et al. | 330/136 |
| 8,816,768 B2 | * | 8/2014 | Tseng et al. | 330/136 |
| 8,897,724 B2 | * | 11/2014 | Hou | 455/91 |
| 8,957,728 B2 | * | 2/2015 | Gorisse | 330/136 |
| 2005/0242792 A1 | * | 11/2005 | Zinn | 323/268 |

(Continued)

*Primary Examiner* — Timothy J Dole
*Assistant Examiner* — Yusef Ahmed
(74) *Attorney, Agent, or Firm* — Andrew Viger; Frank D. Cimino

(57) ABSTRACT

A switched mode assisted linear regulator includes a linear amplifier (LA) and a buck converter configured as a current source. In example embodiments, the buck converter circuit includes a power switch M1 with an M1 body diode (tub), and includes buck turn-off circuitry configured to avoid negative inductor current by controlled switching of the tub to the higher of VIN and a second voltage. For DC-coupled configurations, boost functionality is provided by an LA boost supply, and the tub is switched to the boost supply. For AC-coupled configurations, boost functionality can be provided without boosting the LA supply rail by constraining signal peak-to-peak amplitude to be less than the LA supply voltage (maintaining a DC-average voltage on the AC-coupling capacitor), and the tub is switched to the higher of VIN and VOUT. The buck turn-off circuitry can include zero crossing detection to control M1 tub switches.

19 Claims, 13 Drawing Sheets

(56) References Cited

U.S. PATENT DOCUMENTS

| | | | |
|---|---|---|---|
| 2006/0043946 A1* | 3/2006 | Rose | 323/280 |
| 2006/0132112 A1* | 6/2006 | Oswald et al. | 323/282 |
| 2006/0250825 A1* | 11/2006 | Grigore | 363/21.01 |
| 2007/0165427 A1* | 7/2007 | McDonald et al. | 363/41 |
| 2008/0088284 A1* | 4/2008 | Weng | 323/271 |
| 2008/0157895 A1* | 7/2008 | Immonen et al. | 332/155 |
| 2009/0102448 A1* | 4/2009 | Wang et al. | 323/293 |
| 2009/0278516 A1* | 11/2009 | Bhagwat et al. | 323/270 |
| 2011/0300816 A1* | 12/2011 | Collados et al. | 455/102 |
| 2013/0214858 A1* | 8/2013 | Tournatory et al. | 330/127 |
| 2014/0125299 A1* | 5/2014 | Barth et al. | 323/266 |

* cited by examiner

SWITCHED MODE ASSISTED LINEAR REGULATOR WITH DYNAMIC BUCK TURN-OFF USING ZCD-CONTROLLED TUB SWITCHING

CROSS-REFERENCE TO RELATED APPLICATIONS

This application is a continuation-in-part of U.S. application Ser. No. 13/963,355, filed Aug. 9, 2013, which claims priority to U.S. Provisional Application No. 61/681,901, filed Aug. 10, 2012.

BACKGROUND

1. Technical Field

This Patent Document relates generally to hybrid or composite amplifier/regulator architectures that combine a linear amplifier and a switched mode converter, also referred to as switched mode assisted linear (SMAL) and linear assisted switched mode architectures, and more particularly relates to a SMAL regulator with a buck converter/switcher.

2. Related Art

A hybrid regulator includes a switched mode converter (or switched converter) and a linear amplifier coupled in parallel at a power output node, and cooperatively controlled to supply regulated load voltage. In such hybrid regulators, the higher bandwidth but less efficient linear amplifier supplies the higher frequency content of the output power, while the more efficient but lower bandwidth switched converter provides the lower frequency content.

One application for a hybrid regulator is as an envelope modulated power supply for an RF (radio frequency) power amplifier (PA). Envelope modulation/tracking improves power amplification efficiency for high peak-to-average power ratio (PAR) signals such as typical of mobile RF communications—envelope modulated regulators dynamically control the RF PA supply voltage, tracking PA output power variations/requirements.

Design parameters for an envelope modulated/tracking power supply include noise, distortion and bandwidth. Noise and distortion generated by the envelope modulator and injected into the PA supply pin will transfer to the PA output spectrum. For hybrid regulator architectures, a significant noise source is switching noise from the switched mode converter, and an important design criteria is to reduce small signal output impedance of the linear amplifier over the operational bandwidth of the envelope modulator (the output impedance bandwidth).

Hybrid regulators can be configured with the linear amplifier AC coupled to the power output node, such that the linear amplifier is only required to supply AC content of the load voltage. DC average voltage at the output of the regulator is maintained on the AC coupling (DC-decoupling) capacitor.

While this Background information is presented in the context of regulated power supplies for power amplifier applications, this Patent Document is not limited to such applications, but is more generally directed to hybrid architectures that include a switched mode converter and a linear amplifier.

BRIEF SUMMARY

This Brief Summary is provided as a general introduction to the Disclosure provided by the Detailed Description and Figures, summarizing various aspects and features of the switch mode assisted linear regulator with dynamic buck turn-off to prevent negative inductor current.

The Disclosure describes apparatus and methods for adapting a switched mode assisted linear (SMAL) amplifier architecture as a regulator supplying a regulated dynamic load voltage (and associated load current) to a dynamic load characterized by a signal bandwidth. The SMAL regulator architecture includes a linear amplifier coupled in parallel to a switched mode converter (switched converter or switcher) at a supply node coupled to the load. The SMAL regulator is configured for, and characterized by, a tracking (signal path) bandwidth, related generally as a design-consideration to the signal bandwidth of the dynamic load.

In aspects of the Disclosure, the SMAL regulator architecture includes a linear amplifier and buck converter configured as a current source, and operates with boost functionality: (a) in an aspect of the Disclosure described in connection FIGS. 9A/9B, the linear amplifier is DC-coupled to the buck converter, and boost functionality is provided by a boost supply to the linear amplifier, and (b) in another aspect of the Disclosure illustrated in FIGS. 10A/10B, the linear amplifier is AC-coupled to the buck converter, and boost functionality is provided by maintaining a DC average voltage on a coupling capacitor.

In described examples, a method of supplying a regulated output voltage VOUT, and associated output current, to a dynamic load is useable with a switched mode assisted linear amplifier architecture including an amplifier and a buck switched mode converter (switcher) coupled in parallel at a supply node, where the buck switcher is configured for operation as a current source with a buck inductor, and including a power switching transistor (PMOS) M1 (with an M1 body diode) coupled between a source of input power VIN and the buck inductor. The method includes turning M1 off during buck turn-off conditions, and includes: (a) generating a BUCK_off signal that is asserted when zero buck inductor current is detected; and (b) switching, in response to asserting BUCK_off, the M1 body diode to the higher of VIN and a second voltage. Generating the BUCK_off signal includes: (a) detecting when buck inductor current is zero, (b) detecting when VOUT is greater that VIN, and (c) asserting BUCK_off when buck inductor current is zero and VOUT is greater than VIN.

In described examples, the method is useable in SMAL configurations in which the amplifier circuit is DC-coupled to the supply node, and is operable with a boost supply circuit configured to supply to the amplifier circuit a boost supply voltage OUT_boost that is greater than VIN, and for these configurations, during buck turn-off conditions, the M1 body diode is switched to OUT_boost as the second voltage. In other described examples, the method is useable in SMAL configurations in which the amplifier circuit is AC-coupled to the supply node and supplied by an amplifier supply voltage, and is configured to supply an output voltage VOUT with both peak-to-peak and average voltage less than the amplifier supply voltage, such that the amplifier circuit is operable with boost functionality in which VOUT is greater than VIN, and in these configurations, during buck turn-off conditions, the M1 body diode is switched to the higher of VIN and VOUT as the second voltage.

Other aspects and features of the claimed invention will be apparent to those skilled in the art from the following Disclosure.

BRIEF DESCRIPTION OF THE DRAWINGS

FIGS. 9A/9B illustrate an example embodiment of a SMAL regulator with dynamic buck turn-off for a DC-coupled SMAL configuration in which the linear amplifier is DC-coupled to a buck converter (switcher), where boost functionality is provided by a boost supply to the linear amplifier.

DETAILED DESCRIPTION

This Description and the Figures constitute a Disclosure of example embodiments and applications that illustrate various features and advantages of a switch mode assisted linear (SMAL) regulator configurable to supply to a dynamic load characterized by a signal bandwidth, a regulated load voltage with configurable tracking bandwidth relative to the load signal bandwidth. The SMAL regulator architecture includes a linear amplifier (LA) coupled in parallel with a switched mode converter (switched converter or switcher) at a supply node that is coupled to the load.

Example embodiments of the SMAL regulator are described in the context of an example application as a power supply for an RF power amplifier (PA) characterized by a power bandwidth corresponding to the RF signal bandwidth.

For example, in some example embodiments, the SMAL regulator can be configured so that linear amplifier sets the regulated load voltage and tracking bandwidth, with the switched converter configured and operated as a controlled current source supplying switcher current at a switcher bandwidth that is less than the tracking bandwidth (i.e., supplying lower frequency load current, while the higher bandwidth LA supplies load current not supplied by the switcher).

Figure 9A:
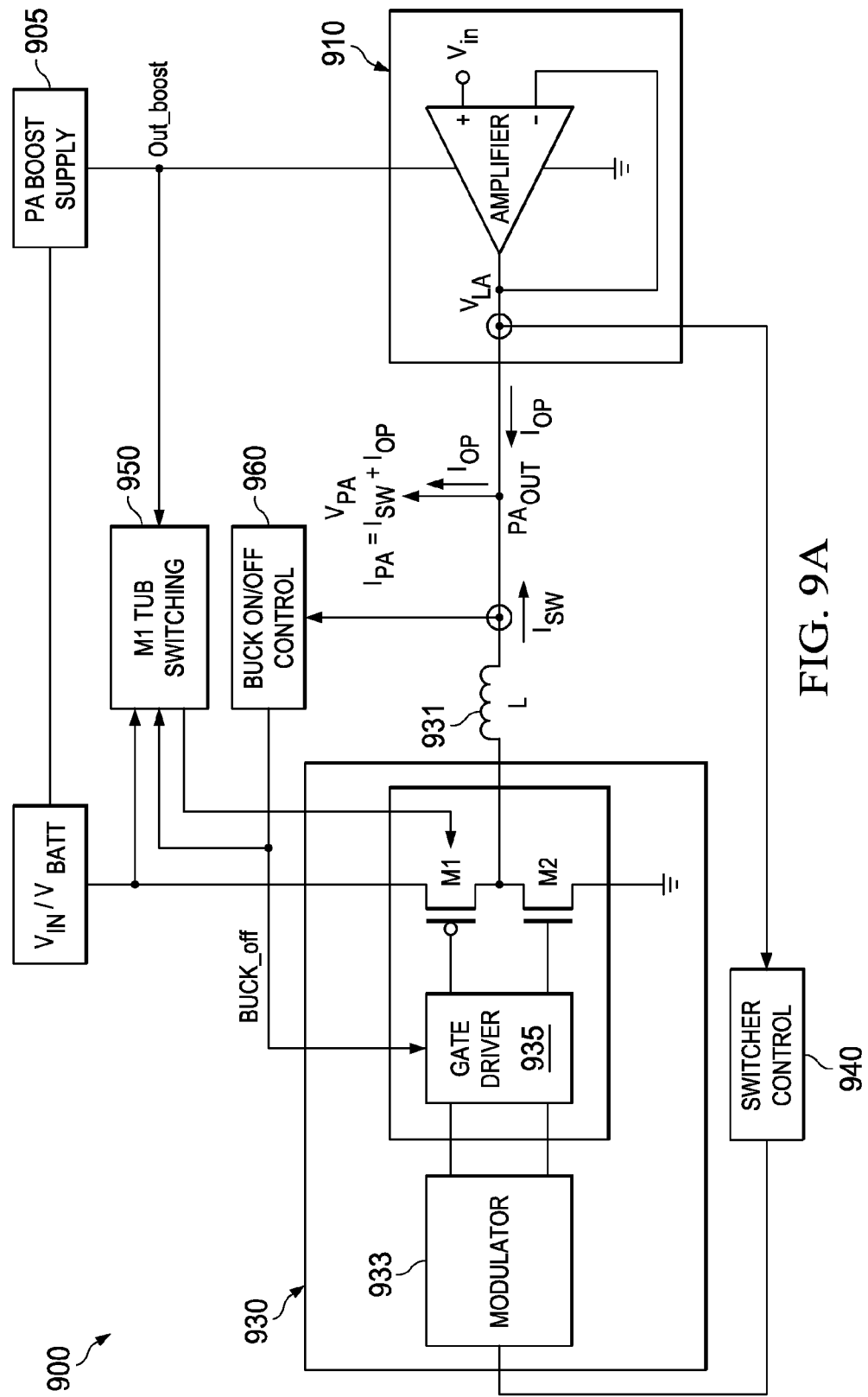
FIGS. 9A/9B and 10A/10B illustrate example embodiments of a SMAL regulator configured with a buck switching converter configured as a current source, and configured for boost functionality in which the linear amplifier supplies a regulated output voltage VOUT to a dynamic load that can be higher than an input voltage VIN (such as supplied by a battery VBATT), including implementing dynamic buck turn-off to avoid negative buck inductor current during boost operation (avoiding operating the buck as a current sink).
Figure 10A:
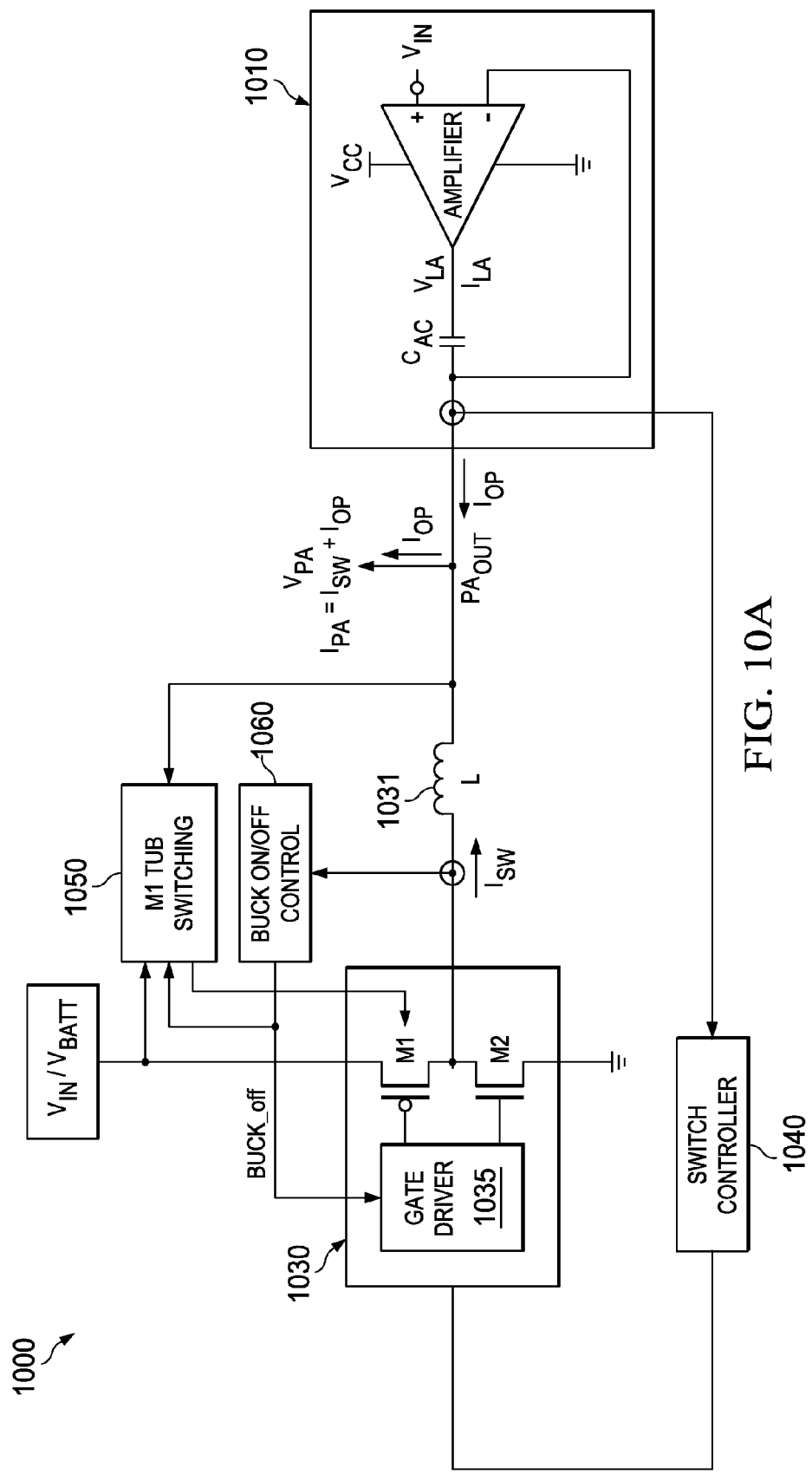
FIGS. 10A/10B illustrate an example embodiment with dynamic buck turn-off for an AC-coupled SMAL configuration in which the linear amplifier is AC-coupled to buck converter, where boost functionality can be provided without boosting the LA supply rail by constraining signal peak-to-peak amplitude to be less than the LA supply voltage, enabling the LA to maintain a DC-average voltage on the AC-coupling capacitor.

In some example embodiments, described in connection with FIGS. 9A/9B and 10/10B, the SMAL regulator is architected with a linear amplifier assisted by a buck converter, and is configured with boost functionality in which the LA can supply regulated output voltage VOUT to a dynamic load that can be higher than an input voltage VIN (such as supplied by a battery VBATT). For these example embodiments, the SMAL regulator is configured with dynamic buck turn-off, including ZCD-controlled tub switching, to avoid negative buck inductor current. FIGS. 9A/9B illustrate a DC-coupled configuration in which boost functionality is provided by a boost supply to the LA. FIGS. 10A/10B illustrate an AC-coupled configuration in which boost functionality is provided by constraining signal peak-to-peak amplitude to be less than the LA supply voltage, enabling the LA to maintain a DC-average voltage on the AC-coupling capacitor.

Envelope Modulation. An example application of a SMAL regulator according to the invention is supply envelope modulation for an RF PA. In an RF transmitter using supply envelope modulation, the supply voltage provided to the RF PA is dynamically modulated to correspondingly track output power variation required by the PA. Envelope modulation provides significant efficiency improvement for high peak-to-average power ratio (PAR) signals typical of RF communications (such as used in mobile handsets and base stations).

Figure 1A:
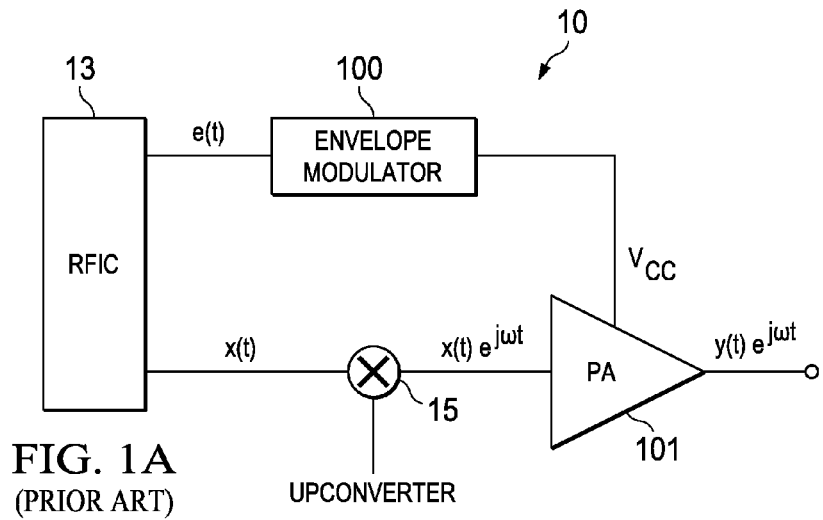
FIGS. 1A and 1B illustrate an example RF transmitter system including a power amplifier (PA), and including an envelope modulator configured to supply envelope modulated power to the PA that tracks power variations/requirements of the PA.

FIG. 1A is a functional illustration of an example RF transmitter system 10 including an RF power amplifier 11 and an RF baseband subsystem 13 commonly referred to as an RFIC (RF integrated circuit). RFIC 13 generates a baseband signal x(t), which is up-converted 15 to RF, and then amplified by the PA (such as for driving an RF antenna).

Envelope modulator 100 supplies power to the PA (the PA supply rail), modulating supply voltage in response to an envelope signal e(t) from RFIC 13. The envelope tracking signal e(t) tracks output power variations/requirements of the PA as determined by RFIC 13. That is, RFIC 13 splits the baseband signal between two separate paths: an envelope tracking signal e(t) that carries envelope (magnitude) information, and a constant magnitude signal x(t), that carries phase information:

$$e(t)=|s(t)| \quad (1)$$

$$x(t)=s(t)/|s(t)| \quad (2)$$

These two signals are merged by the PA. Because the operation in (1) is nonlinear, even though s(t) is bandwidth limited, the envelope signal e(t) will not be, and as a result, the envelope modulation bandwidth typically will be significantly larger than the signal path bandwidth.

Figure 1B:
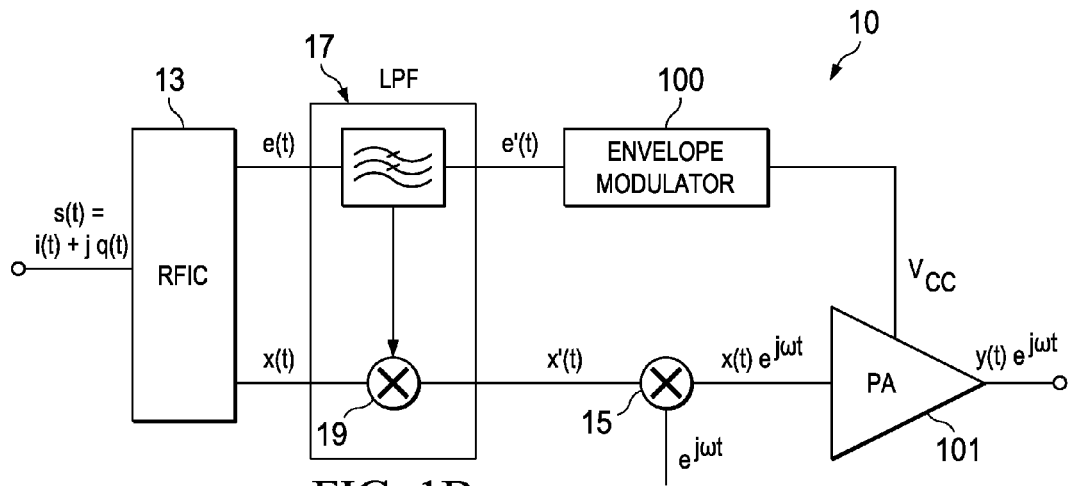

FIG. 1B illustrates an alternate embodiment of the RF transmitter system 10 that includes a low pass filter 17 after RFIC 13. The low pass filter can be configured to reduce the bandwidth of the envelope signal e(t) input to envelope modulator 100. Symbol adjustment 19 prior to up-conversion/mixing 15 can be used to compensate for latency introduced by the low pass filter.

This alternate embodiment represents design trade-offs in terms of overall efficiency of the RF transmitter system 10, including the envelope modulator 100. For example, reducing the bandwidth of envelope modulator 100 (that is, reducing the bandwidth of the envelope tracking signal e(t) input to the envelope modulator) sacrifices some PA efficiency in that the tracking bandwidth of the PA supply voltage is reduced, but is advantageous in terms of improved envelope modulator efficiency. Including symbol adjustment in the x(t) signal path will increase signal path bandwidth, and therefore will increase the bandwidth requirement of the upconverter/mixer and the input to the PA.

Other advantages of limiting envelope tracking bandwidth include reduced receive band noise, and reduced PA gain error. RX band noise is noise measured at the output of the PA within the receive band of the RF transceiver—by reducing the envelope tracking bandwidth, the envelope modulator will introduce less noise and/or distortion, reducing RX band noise. PA gain error is proportional to the difference between the envelope tracking signal through the envelope modulator and the actual envelope tracking signal—if envelope tracking bandwidth is reduced, PA gain error is reduced, reducing RX band noise.

Figure 2:
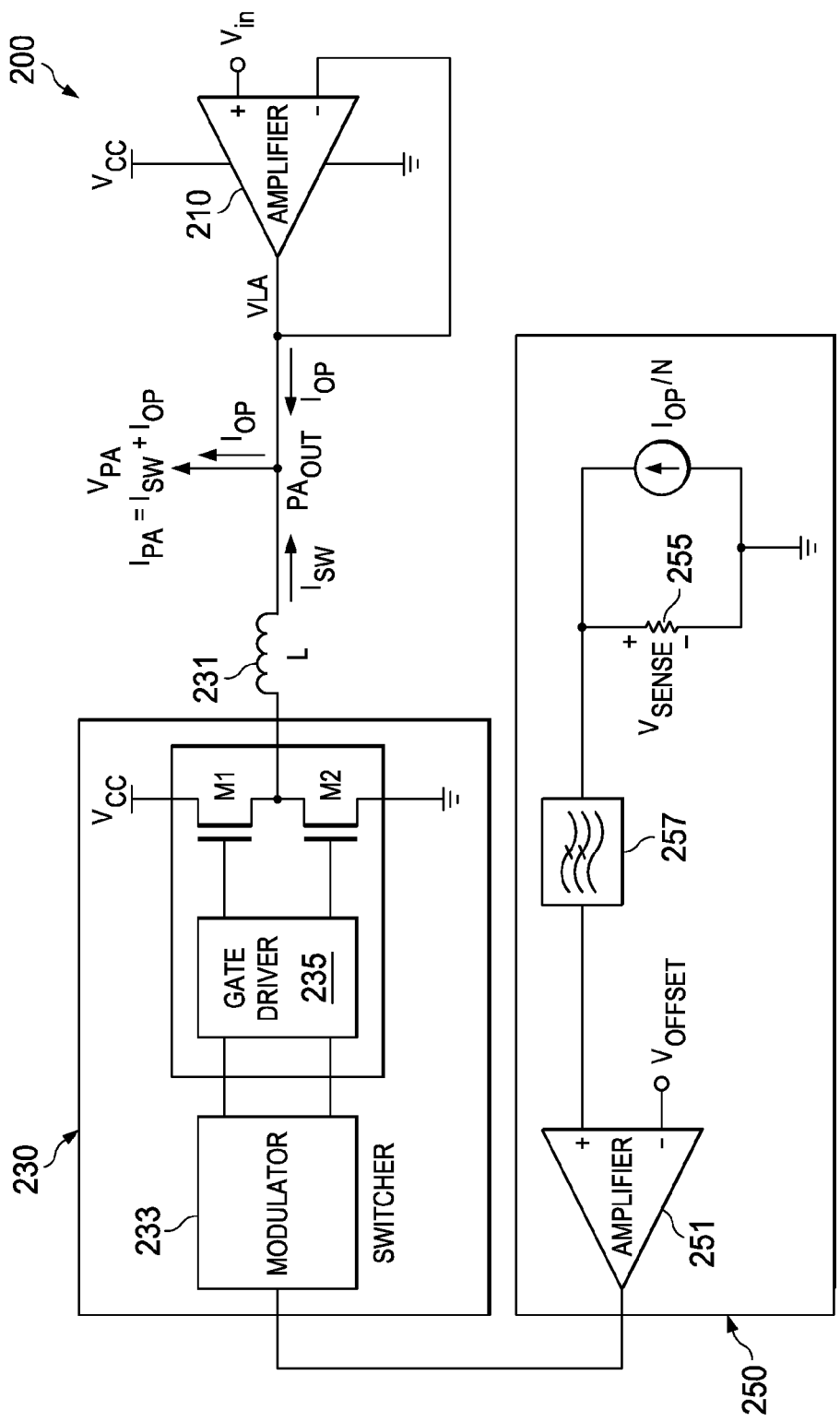
FIG. 2 illustrates an example embodiment of a SMAL (switched mode assisted linear) regulator configured as an envelope modulator/supply for an RF PA, including a switched mode converter configured to supply load current, and a DC coupled linear amplifier configured to supply regulated load voltage, and load current not supplied by the switched converter.

SMAL Regulator—DC Coupled. FIG. 2 illustrates an example embodiment of a SMAL regulator 200 configured to provide regulated power to a load—load voltage $V_{PA}$ and load current $I_{PA}$. SMAL regulator 200 includes a linear amplifier 210 and a switched mode converter 230, with an associated switching controller 250, configured as a current supply. Linear amplifier 210 and switched mode converter 230 are parallel coupled at a supply (current summing) output node $PA_{OUT}$ (coupled to the supply pin of a power amplifier).

For this example embodiment, the linear amplifier is DC coupled to the supply output $PA_{OUT}$ node.

The linear amplifier stage 210 supplies a dynamic load voltage $V_{PA}$ in response to a dynamic input voltage $V_{IN}$. For the example application for use in an RF transmitter system, SMAL regulator 200 is configured as an envelope modulated supply for an RF PA (FIG. 1A), such that the dynamic input voltage $V_{IN}$ is an envelope tracking signal (from an RFIC) and the SMAL regulator supplies dynamic regulated load voltage $V_{PA}$, and the required load current $I_{PA}$, to the PA, Linear amplifier 210 is configured to provide voltage regulation, setting the dynamic load voltage $V_{PA}$ supplied to the PA. Linear amplifier also supplies the required load current $I_{OP}$ not supplied by switched converter 230. SMAL regulator 200 can be configured to maximize the $I_{SW}$ load current from switched converter 230 (current supply), thereby minimizing the $I_{OP}$ load current required to be supplied by linear amplifier 210. In this configuration, a lower bandwidth switched converter supplies lower frequency $I_{SW}$ load current, and a higher bandwidth linear amplifier supplies higher frequency $I_{OP}$ load current, such that $I_{SW}+I_{OP}$ at the $PA_{OUT}$ node supplies the $I_{PA}$ load current required by the PA.

An example embodiment of linear amplifier 210 is described below (FIGS. 7A and 7B), including configuring the linear amplifier to establish the signal path bandwidth for SMAL regulator 200, and including decoupling the configuration of signal path bandwidth from the configuration of output impedance bandwidth. Decoupling output impedance bandwidth from signal path bandwidth enables the output impedance bandwidth to be maximized relatively independent of signal path bandwidth, an important advantage because, in addition to supplying higher frequency load current ($I_{OP}$), linear amplifier 210 can be configured to reject switching noise and ripple generated by switched converter 230.

The example embodiment of switched converter 230 is implemented as a buck converter configured as a current supply/source. Switched converter 230 includes a buck inductor 231, but does not include the output capacitor of a conventional buck voltage regulator. In effect, linear amplifier 210 replaces the conventional buck output capacitor. This example converter topology is a design choice, and alternative implementations of the switched converter include boost, buck-boost and flyback.

According to conventional buck converter design, a controlled modulator circuit 233 controls gate drivers 235 for buck switches (FETs) M1/M2. A switching controller 250 is configured to control the switching duty cycle of the switched converter 230.

Switching controller 250 is implemented with a hysteretic voltage comparator 251. One input to comparator 251 is derived from the $I_{OP}$ load current supplied by the linear amplifier 210, and the other input is a design-specified offset $V_{OFFSET}$. As illustrated, $I_{OP}/N$ from the linear amplifier is converted to a voltage by a resistor 255, and low pass filtered 257 to reduce switching frequency. For the example embodiment, $I_{OP}/N$ is provided by one of the N output transistors of linear amplifier 210, so that the $I_{OP}$ load current supplied by the linear amplifier is provided by N−1 of the N output transistors.

Switching controller 250 can be configured to optimize efficiency of SMAL regulator 200 in supplying power to the PA, which typically results from maximizing the $I_{SW}$ component of the $I_{PA}$ load current supplied by switched converter 230 (subject to bandwidth limitations), and correspondingly minimizing the $I_{OP}$ load current required to be supplied by the linear amplifier 210 (and therefore power dissipation in the linear amplifier). That is, the $I_{SW}$ current sourced/sunk by switched converter 230 is maximized, and the $I_{OP}$ current required to be sourced/sunk by linear amplifier 210 is minimized, such that the higher speed but less efficient linear amplifier delivers the higher frequency $I_{OP}$ content of the dynamic $I_{PA}$ load current, while the more efficient but lower bandwidth switched converter provides the lower frequency $I_{SW}$ content. For example, efficiency optimization typically results from setting the $V_{OFFSET}$ input to comparator 251 to zero.

For the example buck implementation of switched converter 230, bandwidth is limited primarily by the maximum current slew rate through the buck inductor 231 (with inductance L) given by Rising Slew Rate=$(V_{CC}-V_{PA})/L$ Falling Slew Rate=$-V_{PA}/L$ linear amplifier 210 then dynamically sources/sinks the difference between the required $I_{PA}$ load current and the $I_{SW}$ load current supplied by switched converter 230. The inductance L provided by the buck inductor is a design-specified parametric component selection based on design trade-offs.

Figure 3:
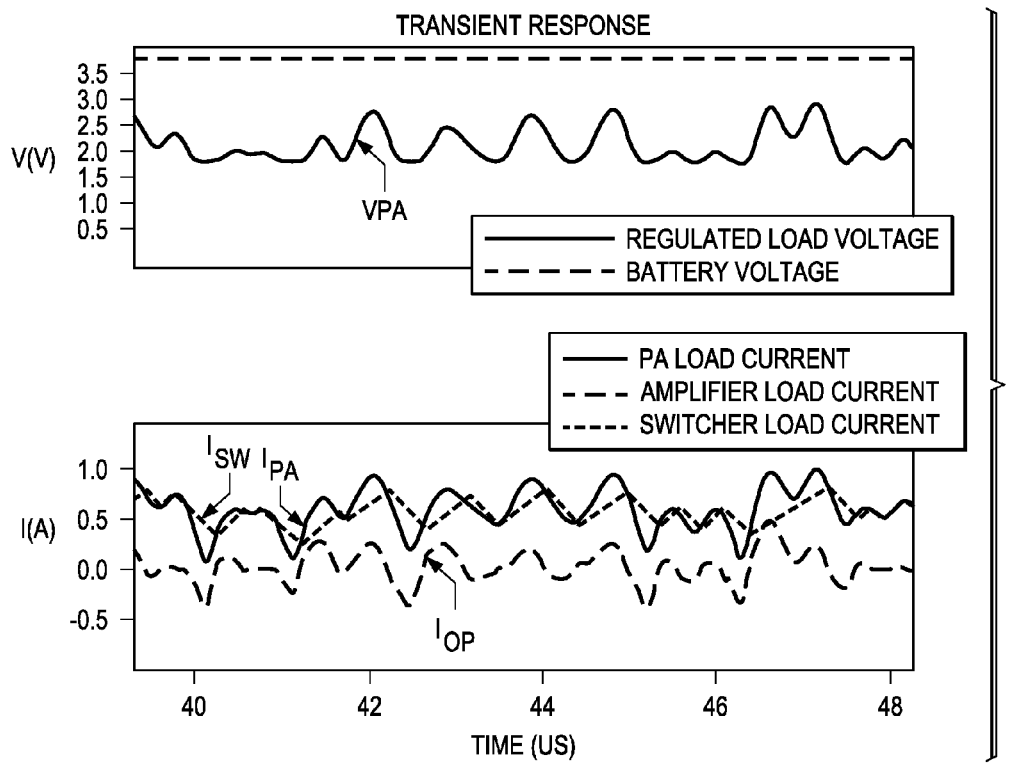
FIG. 3 illustrates, for the SMAL regulator embodiment illustrated in FIG. 2, example waveforms for: (a) in an upper plot, PA load/supply voltage $V_{PA}$ tracking PA output power variations/requirements, and (b) in the lower plot, associated PA load current $I_{PA}$, together with separate plots for $I_{SW}$ load current supplied by the switched mode converter, and additional $I_{OP}$ load current required to be supplied by the linear amplifier.

FIG. 3 illustrates, for SMAL regulator 200, example waveforms for: (a) in the upper plot, $V_{PA}$ load voltage tracking PA output power variations/requirements, as set by the linear amplifier, and (b) in the lower plot, associated $I_{PA}$ load current ($I_{SW}+I_{OP}$), together with separate plots for the lower frequency $I_{SW}$ load current supplied by the switched converter, and the higher frequency $I_{OP}$ load current required to be supplied by the linear amplifier. Note that, for the example embodiment, based on the dynamic requirements of the $I_{PA}$ load current and the bandwidth limitations of the switched converter, both the linear amplifier and the switched converter can source and sink current.

Referring to FIG. 2, as noted, SMAL regulator 200 and linear amplifier 210 can be configured with a signal path bandwidth that is significantly higher than the bandwidth of the switched converter 230. For example, an implementation of a SMAL regulator according to this Disclosure can be configured for a signal path bandwidth in the range of 20 MHz with a converter switching frequency in the range 1-15 MHz (depending on passive components and signal characteristics).

Figure 4:
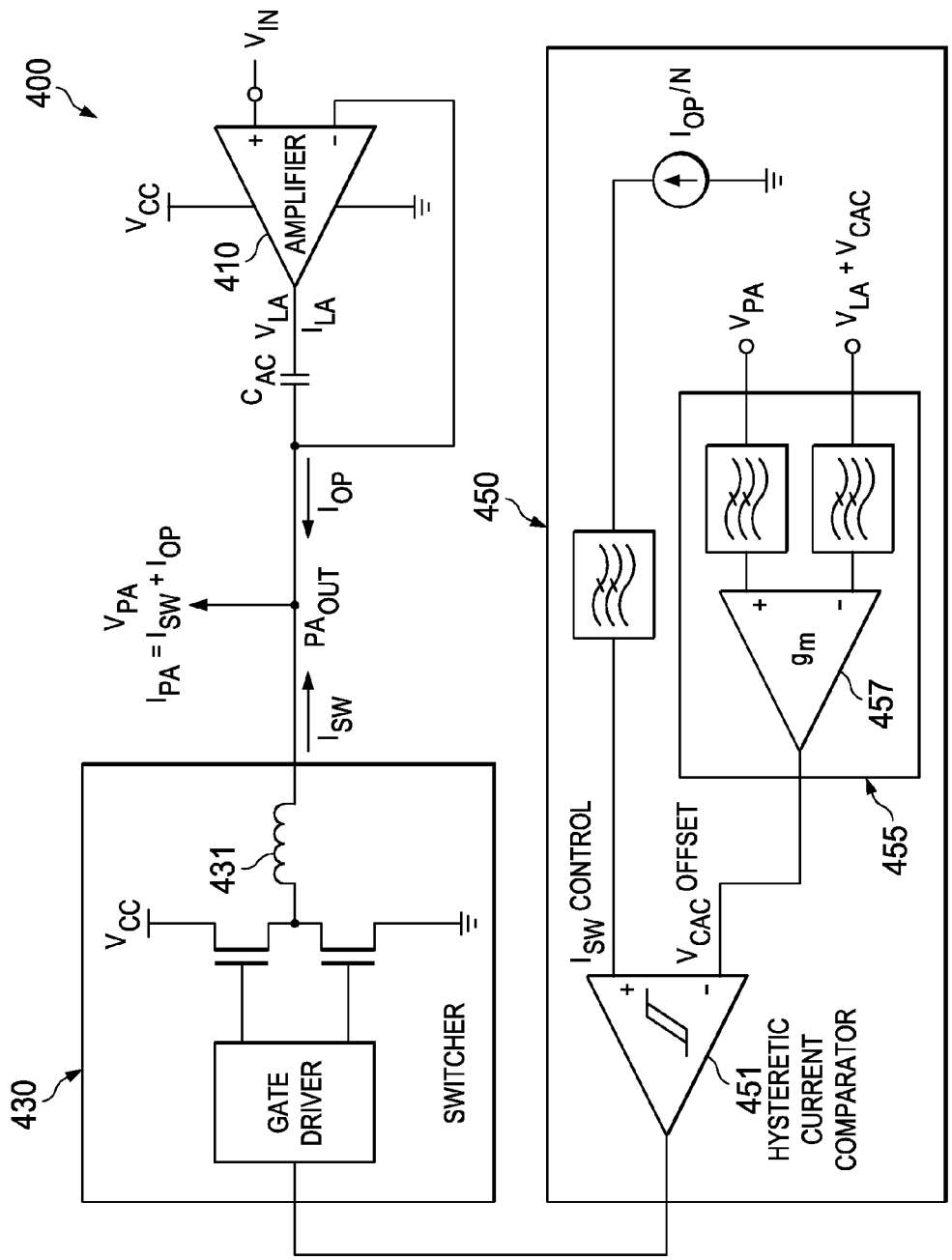
FIG. 4 illustrates an example embodiment of a SMAL regulator in which the linear amplifier is AC coupled ($PA_{OUT}$ supply node) to a switched mode converter configured as a current supply, and in which the switching (current) control loop is configured to effectively control the linear amplifier to provide capacitive charge control for the coupling capacitor.

AC Coupling with Capacitive Charge Control. FIGS. 4, 5 (A/B) and 6 illustrate embodiments of a SMAL regulator in which the linear amplifier is AC coupled to the $PA_{OUT}$ node through an AC coupling (DC decoupling) capacitor $C_{AC}$. For each embodiment, the coupling capacitor $C_{AC}$ is coupled between the linear amplifier output and the $PA_{OUT}$ node, within the external feedback loop of the linear amplifier.

With AC coupling, a design-specified DC-average voltage is maintained on the $C_{AC}$ coupling capacitor, and the linear amplifier supplies the AC content of the $V_{PA}$ load voltage supplied by the SMAL regulator ($PA_{OUT}$ supply node). The $I_{OP}$ load current supplied by the linear amplifier is coupled through the $C_{AC}$ coupling capacitor to the $PA_{OUT}$ node, so that, to maintain the design-specified DC-average voltage on $C_{AC}$, the steady-state average current through the $C_{AC}$ coupling capacitor is zero.

The SMAL regulator can be configured to control the average current input from the linear amplifier into the coupling capacitor $C_{AC}$ to maintain a design-specified DC-average voltage on $C_{AC}$: (a) example embodiments in FIGS. 4 and 5A/B illustrate a SMAL regulator in which the switched mode converter stage includes a capacitive charge control loop that controls the $I_{SW}$ load current to effectively control the output current of the linear amplifier, and (b) an alternate example embodiment in FIG. 6 illustrates a SMAL regulator in which the linear amplifier stage includes a charge control transistor with associated capacitive charge control, configured to control the current output from the linear amplifier into the coupling capacitor.

For the example embodiments, $C_{AC}$ capacitance can be relatively large (for example, in the range of 5-10 uF). In this configuration, the $C_{AC}$ coupling capacitor is not designed to filter switching noise/ripple from switched converter, but instead acts as a DC voltage level shifter, storing a design-specified DC-average of the $V_{PA}$ output voltage. The design-specified level of the DC-average voltage $V_{PA-DC}$ on the $C_{AC}$ coupling capacitor can be set from a register or by calculation from one or more registers.

FIG. 4 illustrates an example embodiment of a SMAL regulator 400 in which a linear amplifier 410 is AC coupled to the $PA_{OUT}$ node through an AC coupling capacitor $C_{AC}$. A switched mode converter 430 includes a switching controller 450 with nested control loops, including a $V_{CAC}$ control loop 455 configured to effect capacitive charge control.

Functionally, $V_{CAC}$ control loop 455 introduces a $V_{CAC}$ offset (corresponding design-specified DC-average voltage $V_{PA-DC}$ on the $C_{AC}$ coupling capacitor) to the into an $I_{SW}$ control loop ($I_{OP}$) that controls the $I_{SW}$ load current supplied by switched converter 430, with the. Responsive to the $V_{CAC}$ offset, switched converter 430 correspondingly adjusts the $I_{SW}$ load current such that the linear amplifier 410 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the DC-average voltage $V_{PA-DC}$.

A design consideration for the AC coupled embodiment of the SMAL regulator 400 is establishing the DC-average voltage $V_{PA-DC}$ relative to the supply voltage of linear amplifier 410. For purposes of illustration, ignoring the DC-average voltage $V_{PA-DC}$, SMAL regulator 400 can supply an output voltage above supply (for example, battery) voltage so long as the signal peak-to-peak amplitude is less than the supply voltage. For example, for a supply voltage of 2.5V and a signal peak-to-peak $V_{PP}$ of 1.6V, boosting the LA supply rail would not be required if the PA load voltage $V_{PA}$ swings from 2V to 3.6V because the signal $V_{PP}$ is below the 2.5V supply voltage (and will remain so as long as the supply voltage remains above 1.6V with appropriate headroom). That is, for the AC coupled example embodiment, the design constraints at the LA are that both $V_{PP}$, and $V_{PA-DC}$ (average $V_{PA}$ output voltage) must be less than the supply voltage by some headroom (in some embodiments, $V_{PA-DC}$ could be zero volts). Thus, AC coupling provides a degree of design freedom in specifying a maximum PA load voltage $V_{PA-PK}$ without requiring boosting the supply rail of the linear amplifier 410. Specifically, $V_{PA-PK}$ can be greater than the supply voltage as long as the $V_{PP}$ and $V_{PA-DC}$ constraints are observed. Contrast the example DC coupled implementation illustrated in FIG. 2 in which $V_{PA-PK}$ is constrained.

Switching controller 450 is configured to control the switched converter (buck) 430, both (a) for steady-state operation, to supply $I_{SW}$ load current that minimizes the $I_{OP}$ load current required to be supplied by linear amplifier 410, and (b) as necessary, to adjust $I_{SW}$ to cause the linear amplifier to output a non-zero-average $I_{LA}$ output current that, in addition to supplying the required $I_{OP}$ load current, charges/discharges the coupling capacitor $C_{AC}$ to maintain the DC-average voltage $V_{PA-DC}$ on the coupling capacitor $C_{AC}$.

Switching controller 450 includes a hysteretic current comparator 451 that defines an $I_{SW}/I_{OP}$ hysteretic window. Hysteretic current comparator 451 receives inputs derived from two (nested) control loops: (a) an $I_{SW}$ control loop based on $I_{OP}/N$ corresponding to the $I_{OP}$ load current supplied by linear amplifier 410, and (b) the $V_{CAC}$ control loop 455 based on the voltage across the coupling capacitor $C_{AC}$. Referring to FIG. 2, the $V_{CAC}$ control loop basically replaces the $V_{OFFSET}$ input to the hysteretic voltage comparator 251.

The $I_{SW}$ control loop operates to drive the buck switched converter to supply $I_{SW}$ load current to minimize the $I_{OP}$ load current from the linear amplifier by maintaining $I_{OP}/N$ (averaged by low pass filtering) within the $I_{SW}/I_{OP}$ hysteretic window. As a result, the linear amplifier outputs (steady-state) a zero-average output current $I_{LA}$, coupled through the coupling capacitor $C_{AC}$ to the $PA_{OUT}$ summing node as the $I_{op}$ load current supplied by linear amplifier 410.

The $V_{CAC}$ control loop 455 is implemented with a transconductance (gm) amplifier 457. The $V_{CAC}$ control loop introduces a $V_{CAC}$ charge control offset into the $I_{SW}/I_{OP}$ hysteretic window, corresponding to the design-specified DC-average voltage $V_{PA-DC}$ (or $V_{CAC}$) on the coupling capacitor $C_{AC}$. Transconductance (gm) amplifier 457 provides a current input to the hysteretic comparator 451 proportional the voltage across the $C_{AC}$ coupling capacitor referenced to $V_{CAC}$: $gm * [V_{PA}-(V_{LA}+V_{CAC})]$. That is, the $V_{CAC}$ offset introduced by the $V_{CAC}$ control loop corresponds to the difference between (a) $V_{PA}$, the PA load voltage, and (b) $(V_{LA}+V_{CAC})$, the linear amplifier output voltage $V_{LA}$ plus the design-specified coupling capacitor offset $V_{CAC}$ (corresponding to the design-specified DC-average voltage $V_{PA-DC}$). Low pass filtering these inputs reduces the requirement for high frequency common mode rejection.

When the voltage on the $C_{AC}$ coupling capacitor deviates from the design-specified offset voltage $V_{CAC}$, the $I_{SW}/I_{OP}$ hysteretic window $(V_{PA}-(V_{LA}+V_{CAC})$ is non-zero, so that the $I_{SW}$ control loop operates to drive switched converter 430 to output an $I_{SW}$ load current that causes the linear amplifier to correspondingly output a non-zero-average $I_{LA}$ current. This non-zero-average $I_{LA}$, in addition to providing the $I_{OP}$ load current through the coupling capacitor $C_{AC}$, charges/discharges $C_{AC}$ to $V_{CAC}$, i.e., until $[V_{PA}-(V_{LA}+V_{CAC})]$ is zeroed. At that point, the nested $I_{SW}$ control loop continues steady-state operation to drive switched converter 430 to supply $I_{SW}$ load current that minimizes the $I_{OP}$ load current required to be supplied by linear amplifier 410. For this steady-state operation (with the design-specified $V_{CAC}$ on the $C_{AC}$ coupling capacitor), the linear amplifier outputs a zero-average $I_{LA}$ current through $C_{AC}$ to the $PA_{OUT}$ summing node as the $I_{OP}$ load current.

For example, assume that switched converter 410 is sourcing current when the $I_{OP}$ load current provided by linear amplifier (LA) 410 is greater than 50 mA, and sinking current when $I_{OP}$ is below 50 mA, so that the $I_{SW}/I_{OP}$ hysteresis window is +50/−50 mA (zero-average $I_{LA}$ current). If the DC average of $V_{PA}$ is above $(V_{LA}+V_{CAC})$, then an offset current of gm times $[V_{PA}-(V_{LA}+V_{CAC})]$ is input to the hysteretic comparator. If, for example, this current is 20 mA, then the new $I_{SW}/I_{OP}$ hysteretic window is +70/−30 mA, and the new LA non-zero-average $I_{LA}$ output current is approximately 20 mA, gradually charging $C_{AC}$ to increase voltage on the coupling capacitor, until the design-specified voltage $V_{CAC}$ is reached (when $V_{PA}-(V_{LA}+V_{CAC})$ is zero).

Figure 5A:
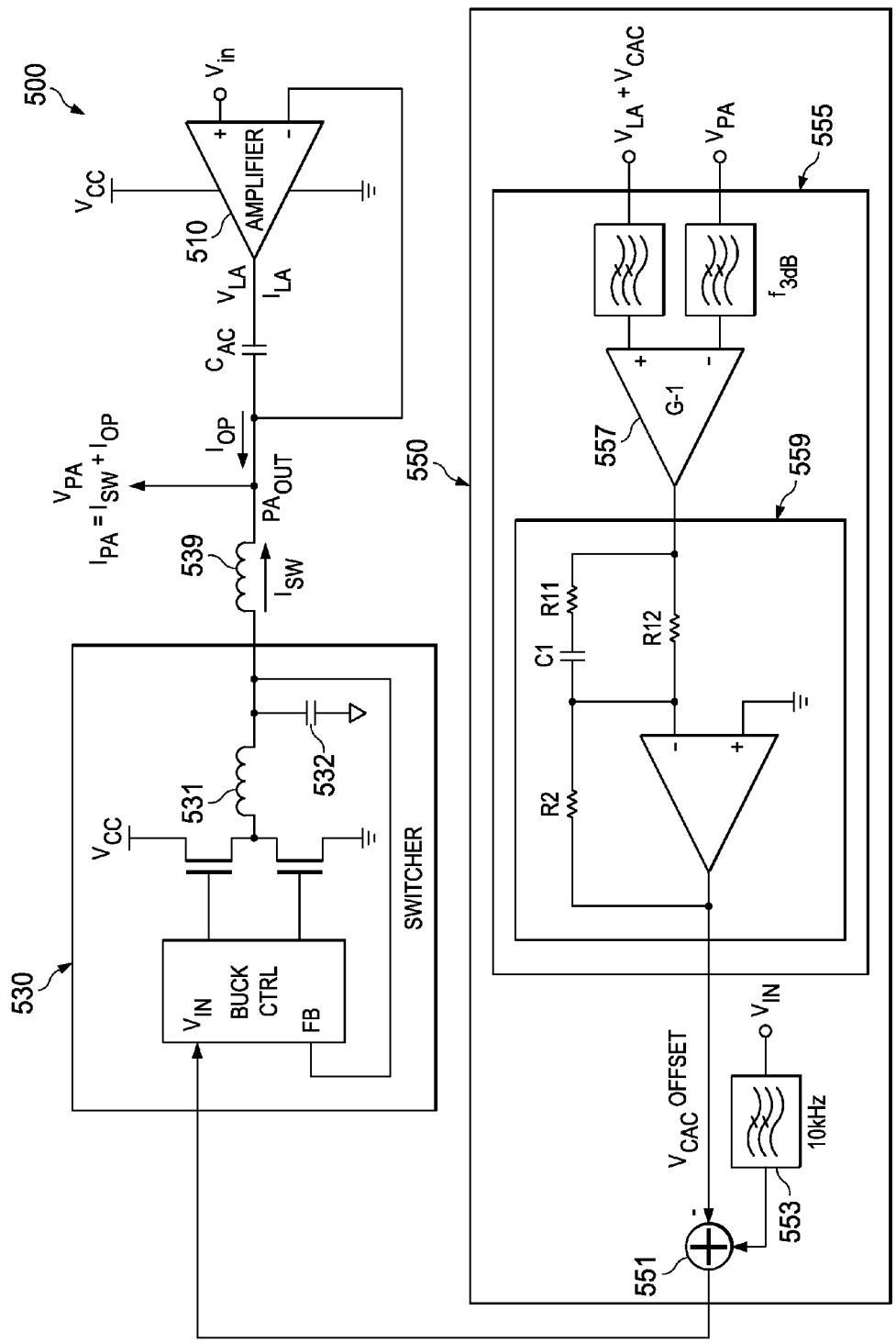
FIGS. 5A and 5B illustrate respectively an example embodiment of, and an equivalent circuit for, an alternate SMAL regulator in which the linear amplifier is AC coupled ($PA_{OUT}$ supply node) to a switched mode converter configured as a voltage supply (supplying current through an output inductor), and in which the switching (voltage) control loop is configured to effectively control the linear amplifier to provide capacitive charge control for the coupling capacitor.
Figure 5B:
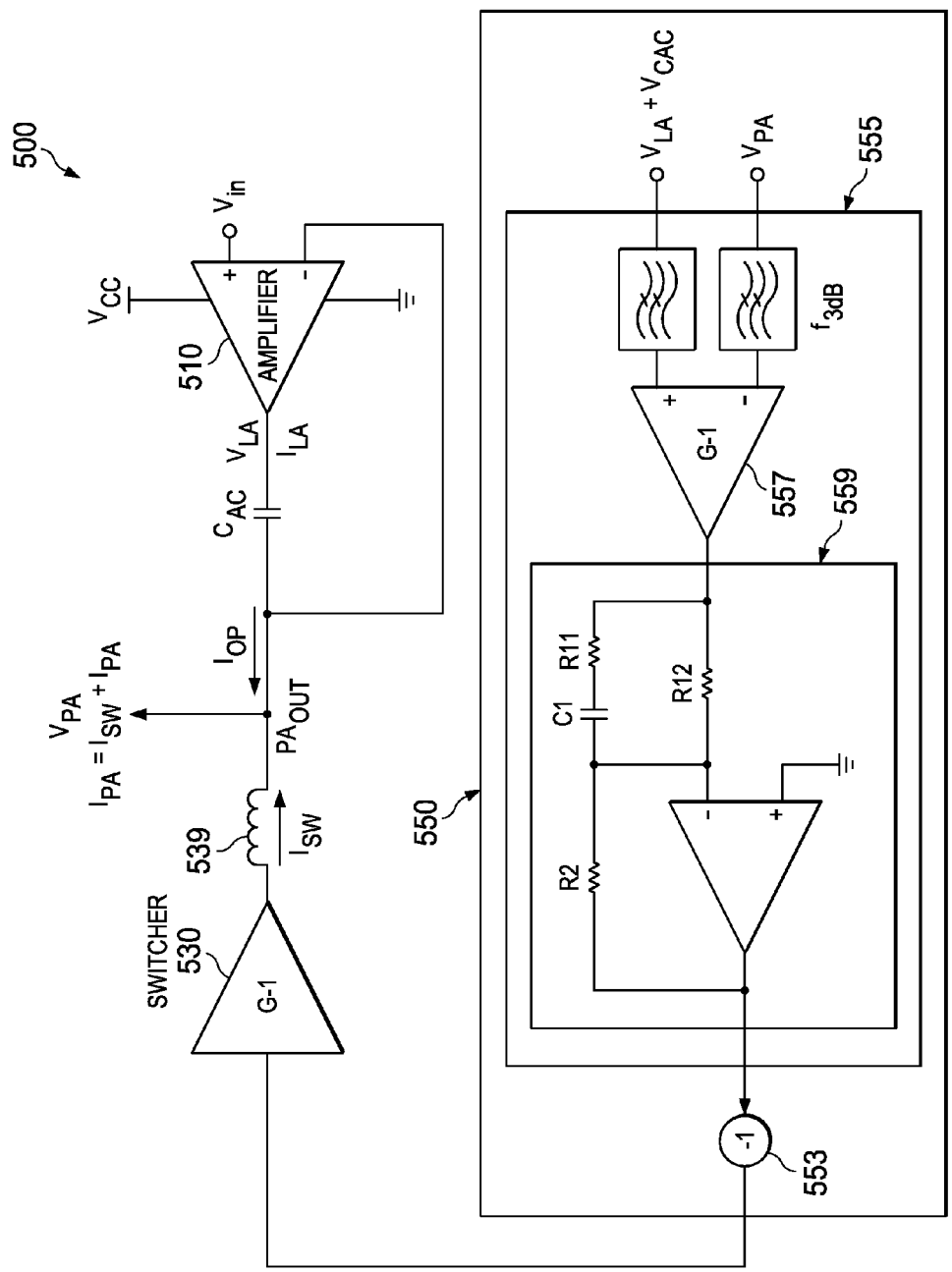
Figure 6:
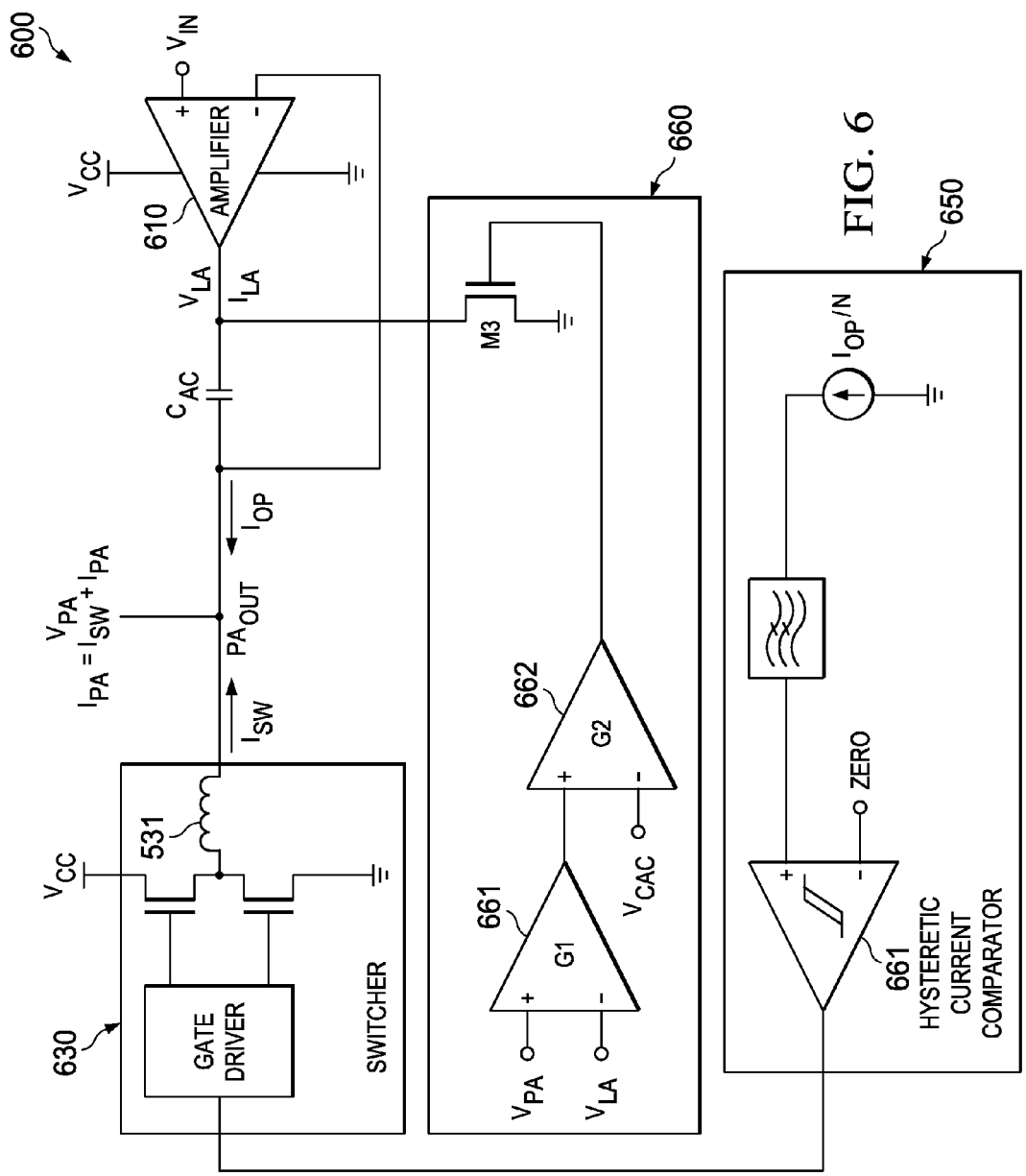
FIG. 6 illustrates an example alternate embodiment of a SMAL regulator in which the linear amplifier is AC coupled to a switched mode converter, and in which capacitive charge control is implemented by a capacitive charge control loop controlling a transistor coupled to the linear amplifier side of the coupling capacitor.

FIGS. 5A and 5B illustrate respectively an example alternate embodiment of, and an equivalent circuit for, a SMAL regulator 500 with AC coupling, adapted for high frequency applications. Linear amplifier 510 is AC coupled through a coupling capacitor $C_{AC}$ to the $PA_{OUT}$ node. For this embodiment, switched mode converter 530 is implemented as a buck voltage supply, including in addition to a buck inductor 531 a buck output capacitor 532. A switching controller 550 provides voltage control to the buck converter 530, which includes a large output inductor 539 that converts the buck voltage supply to a current supply for the $I_{SW}$ load current. Switching controller 550 includes a $V_{CAC}$ control loop 455 configured to effect capacitive charge control.

Functionally, $V_{CAC}$ control loop 555 introduces a $V_{CAC}$ offset into an $I_{SW}$ control loop $(V_{IN})$ that controls the $I_{SW}$ load current supplied by switched converter 530. Responsive to the $V_{CAC}$ offset, switched converter 530 correspondingly adjusts the $I_{SW}$ load current. current such that the linear amplifier 510 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the design-specified $V_{CAC}$ (corresponding to the design-specified DC-Average voltage $V_{PA-DC}$ on the coupling capacitor $C_{AC}$).

Switching controller 550 includes a combiner 551 that receives two signal inputs: (a) an $I_{SW}$ control signal based on the target voltage $V_{IN}$ also input to linear amplifier 510, and (b) a $V_{CAC}$ control signal from $V_{CAC}$ control loop 555 based on the voltage across the $C_{AC}$ coupling capacitor.

For the $I_{SW}$ control signal, the target voltage $V_{IN}$ is averaged by a low pass filter 553, and provides an $I_{SW}$ control input to the switched converter 530 that corresponds to the $V_{PA}$ load voltage set by linear amplifier 510. The $I_{SW}$ control input to switched converter 530 operates to control the supply voltage on the buck output capacitor 532 such that the resulting $I_{SW}$ load current through the output inductor 539 causes the linear amplifier to output (steady-state) a zero-average $I_{LA}$ output current. The $I_{LA}$ output current is coupled through the $C_{AC}$ coupling capacitor to the $PA_{OUT}$ summing node as the $I_{OP}$ load current required to be supplied by the linear amplifier 510.

$V_{CAC}$ control loop 555 is implemented with a voltage amplifier 557 followed by a compensation network 559. The resulting $V_{CAC}$ control signal introduces a $V_{CAC}$ charge control offset signal corresponding to a design-specified coupling capacitor voltage $V_{CAC}$. The output from amplifier 557 is proportional the voltage across the $C_{AC}$ referenced to $V_{CAC}$: $[V_{PA}-(V_{LA}+V_{CAC})]$. That is, the $V_{CAC}$ offset control signal introduced by the $V_{CAC}$ control loop corresponds to the difference between (a) $V_{PA}$, the PA load voltage, and (b) $(V_{LA}+V_{CAC})$, the linear amplifier output voltage $V_{LA}$ plus the design-specified coupling capacitor voltage $V_{CAC}$ (corresponding to the design-specified DC-Average voltage $V_{PA-DC}$ on the coupling capacitor $C_{AC}$). Low pass filtering these inputs reduces the requirement for high frequency common mode rejection.

When the voltage on the $C_{AC}$ coupling capacitor deviates from the design-specified $V_{CAC}$, the $V_{CAC}$ offset control signal from the $V_{CAC}$ control loop 555 $[V_{PA}-(V_{LA}+V_{CAC})]$ will be non-zero. The resulting $I_{SW}$ control signal and $V_{CAC}$ offset control signal are combined by the combiner 551, driving switched converter 530 to adjust the load current $I_{SW}$, and thereby cause linear amplifier 510 to output a non-zero-average $I_{LA}$ current corresponding to $[V_{PA}-(V_{LA}+V_{CAC})]$. This non-zero-average $I_{LA}$, in addition to providing the load current $I_{OP}$, charges/discharges the $C_{AC}$ coupling capacitor to $V_{CAC}$, i.e., until $[V_{PA}-(V_{LA}+V_{CAC})]$ is zeroed. At that point, the $I_{SW}$ control signal (corresponding to the low pass filtered target voltage $V_{IN}$) continues steady-state operation in driving switched converter 530 to supply load current $I_{SW}$ that minimizes the $I_{OP}$ load current from linear amplifier 510. The linear amplifier outputs a zero-average $I_{LA}$ current corresponding to the $I_{OP}$ load current, through the $C_{AC}$ coupling capacitor to the $PA_{OUT}$ summing node.

FIG. 5B illustrates an AC equivalent circuit of the embodiment of SMAL regulator 500 illustrated in FIG. 5A, approximating switched mode converter (buck) 530 as a voltage controlled voltage source. The transfer function of the control loop is given by $$H(s) = \frac{1+sCRc}{sCR_L\left(\frac{sL}{R_L}+1\right)} \times \frac{1}{1+s/(2\pi f3d5)} \times \frac{R_2}{R_{12}} \frac{1+sC_1(R_{12}+R_{11})}{1+sC_1R_{11}}$$

All quantities are shown in FIG. 5B except $R_C$ which is the ESR of the coupling capacitor CAC (designated C in the transfer function) and $R_L$ which is the ESL of L. Poles and zeros are: P1=0; P2=−RL/L; P3=−2πf3 dB; P4=−1/C1R11; Z1=−1CRC; Z2=−1/(C1(R12+R11)). For example: (P2) assuming ESR of 100 mOhm and L of 100 uH, this pole can be located at 160 Hz; (P3) this pole can provide additional freedom to filter out any high frequency noise across the capacitor C, caused by the linear amplifier current; (P4) this pole can provide additional freedom to filter out any high frequency noise across the capacitor C, caused by the linear amplifier current; (Z1) assuming ESR of 20 m Ohm and C of 50 uF, this zero can be located at 166 kHz (very high frequency pole); (Z2) this zero can be set to stabilize the loop and increase phase margin.

FIG. 6 illustrates an example embodiment of an alternate SMAL regulator architecture 600 with AC coupling, in which capacitive charge control is implemented in the linear amplifier stage. Specifically, linear amplifier stage 610 includes a $V_{CAC}$ (charge) control transistor M3 and associated $V_{CAC}$ control circuit 660. For the example embodiment, $V_{CAC}$ control transistor M3 is an operating mode transistor operated in the linear region to provide capacitive charge control—in another operating mode not the subject of this Patent Document, is used to ground the coupling capacitor (with the linear amplifier is disabled).

SMAL regulator 600 includes a switched converter 630 implemented as a buck current supply. The buck switched converter 630 is coupled through a buck inductor 631 to the $PA_{OUT}$ node.

A switching controller 650 is configured to control switched converter 630 to supply $I_{SW}$ load current that minimizes the $I_{OP}$ load current required to be supplied by linear amplifier 610. Switching controller 650 includes a hysteretic current comparator 651 that defines an $I_{SW}/I_{OP}$ hysteretic window. The hysteretic current comparator 651 receives an $I_{OP}/N$ input derived from an $I_{SW}$ control loop based on a current $I_{OP}/N$ corresponding to the $I_{OP}$ load current supplied by linear amplifier 610. This $I_{OP}/N$ input is compared to a zero reference corresponding to the DC average of the $I_{OP}$ load current (for AC coupled implementations, zero). The $I_{SW}$ control loop operates to drive switched converter 630 to supply $I_{SW}$ load current to minimize the $I_{OP}$ load current from the linear amplifier by maintaining $I_{OP}/N$ (low pass filtered) within the $I_{SW}/I_{OP}$ hysteretic window. As a result, linear amplifier 610 outputs (steady-state) a zero-average output current $I_{LA}$, coupled through the $C_{AC}$ coupling capacitor to the $PA_{out}$ summing node as the $I_{OP}$ load current supplied by the linear amplifier 610.

$V_{CAC}$ control loop 660 includes cascade differential amplifiers 661 and 662, configured to implement $V_{CAC}$ control based on the voltage across the $C_{AC}$ coupling capacitor (corresponding to the design-specified DC-Average voltage $V_{PA\text{-}DC}$). The output of amplifier 662 provides a $V_{CAC}$ control signal to the M5 control gate.

$V_{CAC}$ control loop 660 can be represented as $[V_{PA}-(V_{LA}+V_{CAC})]$, or for the configuration of FIG. 6, $[(V_{PA}-V_{LA})-V_{CAC})]$. That is, the amplifiers 661/662 generate the $V_{CAC}$ control signal which corresponds to the voltage across the coupling capacitor $(V_{PA}-V_{LA})$ relative to the design-specified voltage $V_{CAC}$ (corresponding to the design-specified DC-Average voltage $V_{PA\text{-}DC}$ on the coupling capacitor $C_{AC}$). In particular, feedback ensures that $V_{CAC}$ applied to the negative input of amplifier 662 will appear across the $C_{AC}$ coupling capacitor, which allows precise control of the $V_{CAC}$ coupling capacitor voltage.

When the voltage on the $C_{AC}$ coupling capacitor deviates from the design-specified $V_{CAC}$ (non-zero $[(V_{PA}-V_{LA})-V_{CAC})]$) the $V_{CAC}$ control signal from $V_{CAC}$ control loop 660 (amplifier 662) controls M3 to effect charging/discharging the coupling capacitor $C_{AC}$, until $[(V_{PA}-V_{LA})-V_{CAC})]$ is zeroed. The separate $I_{SW}$ control loop 650 continues steady-state operation, driving switched converter 630 to supply $I_{SW}$ load current that minimizes the $I_{OP}$ load current required to be supplied by the linear amplifier 610. In this steady-state case (with $V_{CAC}$ on the $C_{AC}$ coupling capacitor), linear amplifier 610 outputs a zero-average $I_{LA}$ current through $C_{AC}$ to the $PA_{OUT}$ summing node as the $I_{OP}$ load current.

Figure 7A:
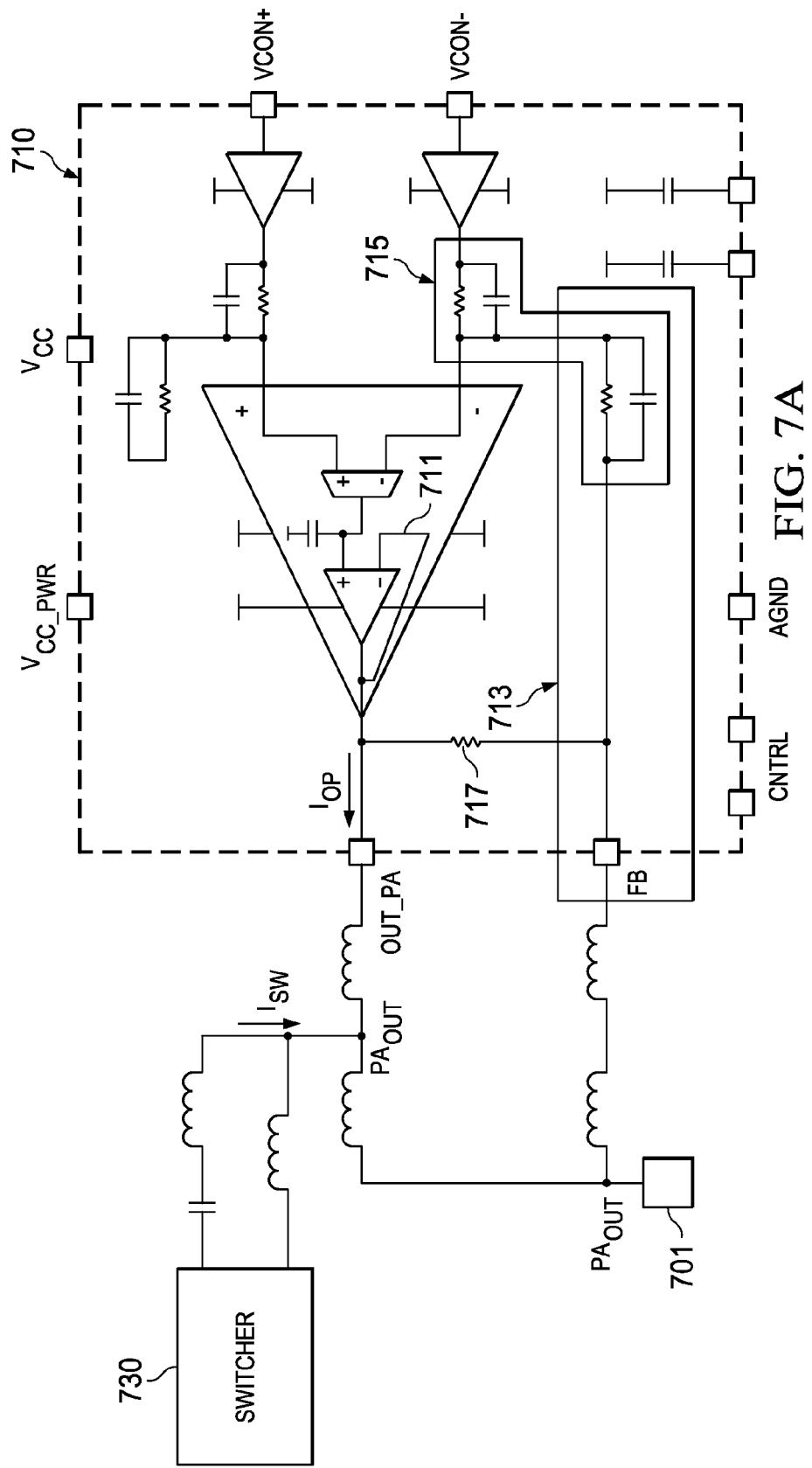
FIG. 7A illustrates an example embodiment of a SMAL regulator including a linear amplifier design with decoupled output impedance and signal path bandwidth, including a local/internal (higher speed) feedback loop configured for increased output impedance bandwidth, and an external feedback network configurable to establish signal path bandwidth independent of output impedance bandwidth.
Figure 7B:
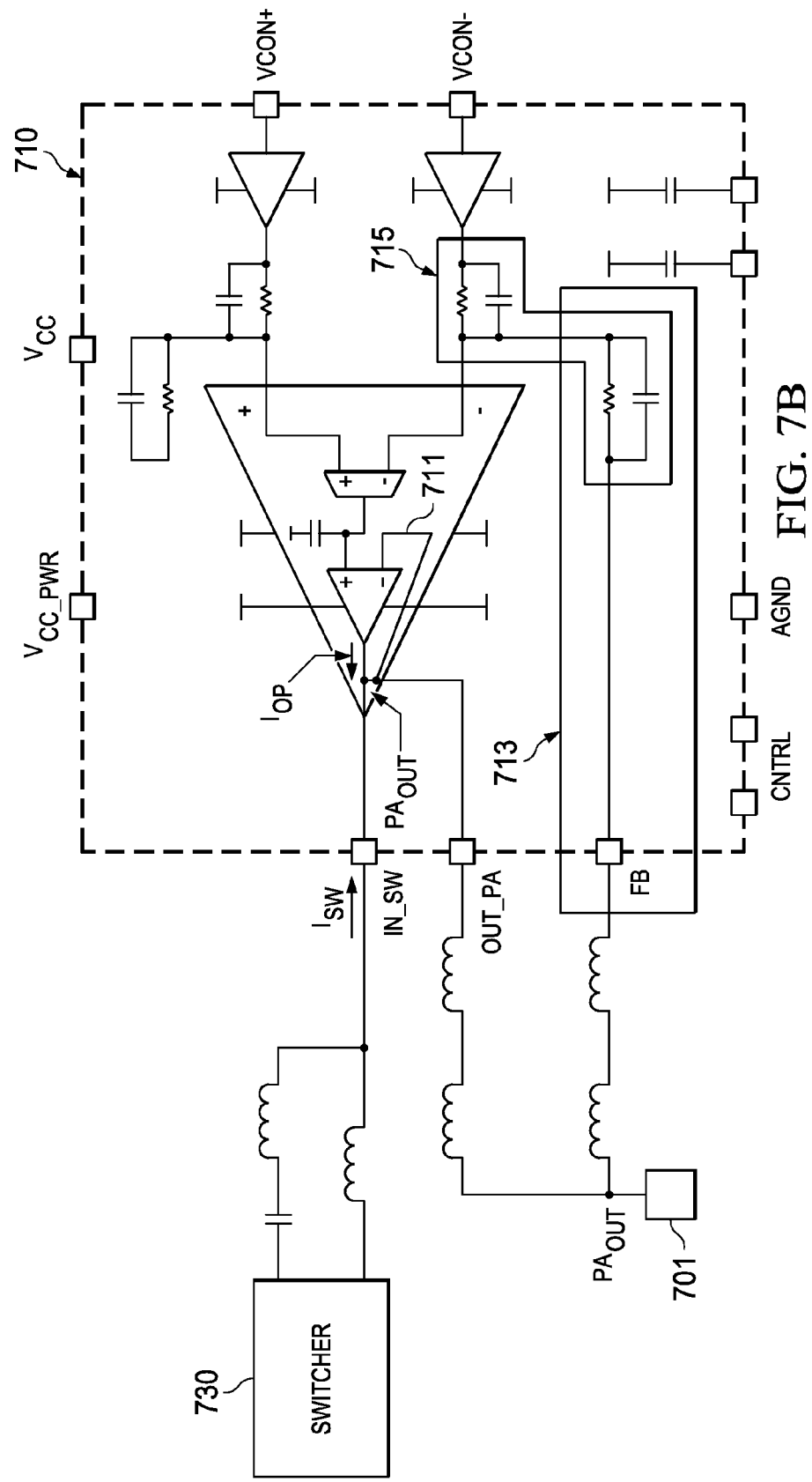
FIG. 7B illustrates an example alternate embodiment of the SMAL regulator of FIG. 7A, in which the switched mode converter is coupled directly to the local/internal feedback loop of the linear amplifier, reducing parasitic trace inductance (coupled, for an example IC implementation, to a dedicated IN_SW pin).

Decoupling Output Impedance and Signal Path Bandwidth. FIGS. 7A and 7B illustrate example embodiments of SMAL regulator 700 in a system configuration with a power amplifier 701 (such as for use in the RF transmitter system illustrated in FIG. 1A/B). SMAL regulator 700 includes linear amplifier 710 and a switched mode converter 730, parallel coupled at an output node $PA_{OUT}$ to PA 701. Control for the switched mode converter is integrated with the switched mode converter and not separately illustrated (compare, for example, controller 250 in FIG. 2).

As illustrated, the example embodiments of SMAL regulator 700 are configured with DC coupling (such as also illustrated in FIG. 2). With appropriate modification, the Description related to these embodiments would also apply to AC coupled embodiments/implementations.

As illustrated, linear amplifier 710 and switched converter 730 are implemented as separate integrated circuits (ICs)—a SMAL regulator according to this Disclosure can be adapted to a single-IC implementation. System interconnect will necessarily include trace inductance that can impact operation at higher frequencies (discussed in connection with the embodiment in FIG. 7B).

SMAL regulator 700 supplies to the PA ($PA_{OUT}$) regulated voltage $V_{PA}$ and current $I_{PA}$. In accordance with this Disclosure, (a) PA load voltage $V_{PA}$ is dynamically set by the linear amplifier 710, and (b) PA load current $I_{PA}$ is supplied by linear amplifier 710 with primary current assist supplied by switched converter 730. Switched converter 730 is configured to supply lower frequency $I_{SW}$ load current, and the linear amplifier 710 is configured to supply $I_{OP}$ load current not supplied by the switched converter, i.e., sourcing/sinking PA load current $I_{PA}$ not supplied by the switched converter). $I_{SW}$ and $I_{OP}$ are summed at the $PA_{OUT}$ supply node.

Linear amplifier 710 outputs voltage $V_{LA}$ and current $I_{LA}$. For the example DC coupled implementations, output voltage $V_{LA}$ corresponds to the regulated load voltage $V_{PA}$ supplied to PA 701, and output current $I_{LA}$ corresponds to the load current $I_{OP}$ supplied by the linear amplifier. For the example IC implementations, $V_{LA}$ and $I_{LA}$ are available at an output pin OUT_PA.

The example embodiment of a linear amplifier design 710 can be configured for decoupling output impedance and signal path bandwidth, enabling signal path bandwidth to be established relatively independent of output impedance bandwidth. The linear amplifier includes a local/internal (higher speed) feedback loop configured for controlling output impedance bandwidth, and a global/external feedback network configurable to independently establish signal path bandwidth. As used in this Disclosure, output Impedance bandwidth refers to the bandwidth over which the output impedance of a SMAL regulator remains low relative to the frequencies of interest and the load.

Figure 8:
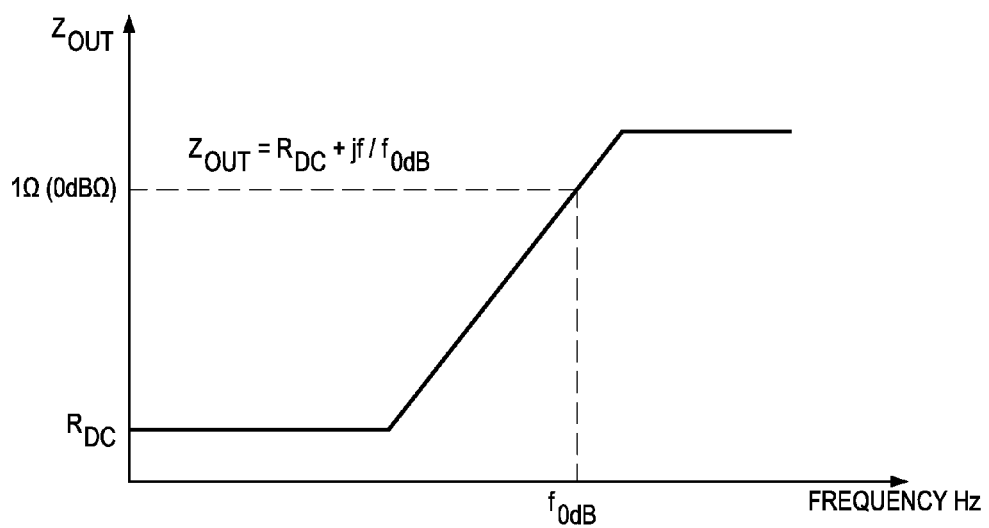
FIG. 8 illustrates closed-loop output impedance ($Z_{OUT}$) as a function of frequency.

FIG. 8 illustrates the relationship between closed-loop output impedance (Zout) and frequency—this description will be in the context of a negative feedback operational amplifier which corresponds in relevant respects to a linear amplifier such as used in a SMAL regulator according to this Disclosure. The closed-loop output impedance Zout is characterized by a low resistance $R_{DC}$ at lower frequencies where the amplifier has significant loop gain. At higher frequencies, the amplifier loop gain drops and output impedance Zout increases. A design parameter is the zero dB crossing frequency f0dB (ZCF), defined as the frequency at which system output impedance rises to zero dB-ohms (1 ohm in non-dB units).

In the context of the example RF application, the higher the ZCF for the output impedance of the linear amplifier, the higher the output impedance bandwidth, and the lower the RX band noise at a power amplifier. That is, a linear amplifier with a high ZCF relative to the RF frequencies of interest is advantageous in actively rejecting high-frequency voltage disturbances introduced internal to a SMAL regulator by the switched mode converter, or externally from the dynamic PA load (noise output from the PA supply pin). Thus, it can be advantageous to increase output impedance bandwidth (increase ZCF) to reduce RX band noise. However, a design trade-off can be to reduce signal path bandwidth to increase efficiency (that is, limiting signal path bandwidth to the bandwidth requirement for envelope tracking) and/or increase design flexibility (such as by reducing design complexity).

FIGS. 7A/7B include a high level example functional illustration of a linear amplifier design 710, including decoupling output impedance bandwidth from signal path bandwidth. Specific implementations of a linear amplifier for use in a SMAL regulator according to this Disclosure represent a design choice, and other amplifier architectures are adaptable as a linear amplifier according to this Disclosure, including implementing design alternatives and/or trade-offs to improve efficiency under different operating conditions and for different applications.

Referring to FIG. 7A, linear amplifier 710 receives a differential envelope tracking signal (VCON+/−), such as from an RFIC (this differential signal corresponds to $V_{IN}$ in FIGS. 2, 4, 5A/5B and 6). In response, linear amplifier 710 supplies a regulated, single-ended load voltage $V_{PA}$ (or $V_{LA}$) to the PA 701.

Linear amplifier 710 includes both an internal (higher speed) feedback loop 711 configured for reducing output impedance at the frequencies of interest, and an external (lower speed) feedback network 713 configured to establish signal path bandwidth. For the illustrated IC implementation, the external feedback network 713 is connected to $PA_{OUT}$, between the FB and OUT_PA pins.

The local/internal (higher speed) feedback loop 711 enables increased output impedance bandwidth. The internal feedback loop 711 reduces output impedance at higher frequencies, increasing zero crossing frequency (ZCF in FIG. 8), and thereby increasing output impedance bandwidth. A capacitive divider network 715 at the inverting VCON− input to linear amplifier 710 can be used to provide further control at higher frequencies.

The global/external feedback network 713 can be configured to establish signal path bandwidth, including optimizing SMAL regulator 700 for reduced signal path bandwidth leading to increased efficiency. For example, using relatively large resistive values in the external feedback loop 713 will slow the feedback loop, and reduce signal path bandwidth, without appreciably affecting output impedance bandwidth for the frequencies of interest. In addition, a parallel resistance 717 can be used to stabilize the external feedback loop 713 at high frequencies by shorting the (trace) inductance in the feedback loop between the OUT_PA and FB pins, thereby improving phase margin.

FIG. 7B illustrates an example alternate embodiment of the SMAL regulator 700 of FIG. 7A, in which switched converter 730 is connected at the output of the linear amplifier 710, effectively at the local/internal feedback loop 711, reducing parasitic trace inductance between switched converter 730 and linear amplifier 710. For the example IC implementation, switched converter 730 connects to a separate IN_SW pin of linear amplifier 710. With this system interconnect configuration, the $PA_{OUT}$ node is effectively at the linear amplifier, reducing the affects of trace inductance (distortion caused by switching and ripple noise).

Dynamic Buck Turn-Off. FIGS. 9A/9B and 10A/10B illustrate example embodiments of a SMAL (switched mode assisted linear) regulator configured with a buck switching converter (Buck) configured as a current source, and implementing dynamic buck turn-off. The SMAL regulator is configured for boost functionality in which the linear amplifier (LA) supplies a regulated output voltage VOUT to a dynamic load that can be higher than an input voltage VIN (such as supplied by a battery VBATT). For the example application in which the dynamic load is a power amplifier PA, the VOUT is designated in FIGS. 9A/9B and 10A/10B as $PA_{OUT}$.

For these embodiments, the SMAL regulator is configured for dynamic buck turn-off to avoid negative buck inductor current during boost operation (avoiding operating the buck as a current sink). That is, for operation where the LA is supplying $PA_{OUT}$ higher than VIN/VBATT, buck inductor current can turn negative, sinking current from the LA. Disadvantages of negative buck current (negative $I_{SW}$ in FIGS. 9A/9B and 10A/10B) include loss of efficiency and $PA_{OUT}$ distortion (for example, if buck negative current is more than the linear amplifier can supply in addition to load current).

FIGS. 9A/9B illustrate an example embodiment with dynamic buck turn-off for a DC-coupled SMAL configuration 900 (such as in FIG. 2) in which LA 910 is DC-coupled to Buck converter 930/940 (at the $PA_{OUT}$ supply node), and where boost functionality is provided by a boost supply 905 to the LA. FIGS. 10A/10B illustrate an example embodiment with dynamic buck turn-off for an AC-coupled SMAL configuration 1000 (such as in FIG. 4, 5A/B, 6), in which the LA 1010 is AC-coupled to Buck converter 1030/1040 (at the $PA_{OUT}$ supply node), and where boost functionality can be provided without boosting the LA supply rail by constraining signal peak-to-peak amplitude to be less than the LA supply voltage, enabling the LA to maintain a DC-average voltage on the AC-coupling capacitor (as described above in connection with FIG. 4).

Dynamic buck turn-off uses buck inductor current zero crossing detector to turn off the main PMOS power switch (M1) channel, and switch the M1 tub/body to a higher potential. Conventional tub switching for a buck converter involves switching the PMOS tub from converter input or output based on a comparison of converter input/output voltage. This type of control is ineffective for a SMAL regulator with boost functionality. Dynamic buck turn-off with ZCD-controlled tub switching is based on sensing negative inductor current to initiate/control tub-switching. In effect, the VOUT average (instead of instantaneous) voltage is compared against VIN/ VBATT (where VOUT instantaneous voltage driven by the LA is beyond Buck bandwidth).

In brief overview, example embodiments of the SMAL regulator include an amplifier circuit and a buck converter circuit coupled in parallel at a supply node coupled to the load. The amplifier circuit configured to set load voltage VOUT. The buck converter circuit configured to couple to the supply node through a buck inductor, and configured for operation as a current source supplying a buck inductor current that is a controlled portion of the output current. The buck converter circuit includes: (a) a power switching transistor (PMOS) M1, with an M1 body diode, coupled between VIN and the buck inductor; (b) M1 gate driver circuitry controlling M1 switching, including turning M1 off during buck turn-off conditions; and (c) buck turn-off circuitry operable during buck turn-off conditions to switch off the M1 channel, and switch the M1 body diode to the higher of VIN and a second voltage. The buck turn-off circuitry includes: (a) buck on/off circuitry configured to provide a BUCK_off signal that is asserted when zero buck inductor current is detected; and (b) tub switching circuitry responsive to BUCK_off asserted by the ZDC circuitry to switch the M1 body diode to the higher of VIN and the second voltage. The tub switching circuitry including: (a) ZCD circuitry configured to detect when buck inductor current; is zero; and (b) VOUT detect circuitry configured to detect when VOUT is greater that VIN; such that (c) BUCK_off is asserted when buck inductor current is zero and VOUT is greater than VIN In example embodiments, the amplifier circuit is DC-coupled to the supply node, and receives from a boost supply circuit a boost supply voltage OUT_boost that is greater than VIN, and wherein the tub switching circuitry is operable during buck turn-off conditions to switch the M1 body diode to OUT_boost as the second voltage. In other example embodiments, the amplifier circuit is AC-coupled to the supply node and supplied by an amplifier supply voltage OUT_boost, and is configured to supply an output voltage VOUT with both peak-to-peak and average voltage less than the amplifier supply voltage, providing boost functionality in which VOUT is greater than VIN, and wherein the tub switching circuitry is operable during buck turn-off conditions to switch the M1 body diode to the higher of VIN and VOUT as the second voltage.

For the DC-coupled embodiments, the tub switching circuitry can be configured with first and second PMOS tub switching transistors (switches) series-connected between OUT_boost and VIN, with the first tub switch drain connected to VIN, and the second tub switch source connected to OUT_boost, and with a tub-switching node between the first and second tub switches connected to the M1 body diode, the first tub switch controlled by BUCK_off, and the second tub switching transistor controlled by an inverted BUCK_off, such that, when BUCK_off is asserted, signaling zero buck inductor current, the M1 body diode is switched to OUT_boost. For these embodiments, the first and second switches are switched with non-overlap timing to avoid shoot-through current.

For the AC-coupled embodiments, the tub switching circuitry can be configured with first and second PMOS tub switching transistors (switches) series-connected between VOUT and VIN, with the first tub switch drain connected to VIN, and the second tub switch drain connected to VOUT, and with a tub-switching node between the first and second tub switches (sources) connected to the M1 body diode, the first tub switch controlled by BUCK_off, and the second tub switching transistor controlled by an inverted BUCK_off, such that, when BUCK_off is asserted, signaling zero buck inductor current, the M1 body diode is switched to the higher of VOUT and VIN. For these embodiments, the first and second switches are switched with overlap timing to conduct sufficient negative buck inductor current to prevent overvoltage at the buck switching node.

FIGS. 9A/9B illustrate a SMAL regulator 900 with a DC-coupled LA 910 in parallel with a Buck 930 at supply node $PA_{OUT}$. An LA boost supply 905 provides a boost supply rail OUT_boost for the LA 910.

Dynamic buck turn-off includes M1 tub switching circuit 950, and a Buck on/off control unit 960. When buck inductor current turns negative, buck on/off control unit 960 asserts BUCK_off to gate driver 935 and M1 tub switching circuit 950, controlling M1 channel turn-off and M1 tub switching. In particular, in response to BUCK_off, M1 tub switching circuit 950 implements a tub-switching control mechanism to dynamically switch the M1 tub to OUT_boost (which is higher than VIN/VBATT). When output voltage $PA_{OUT}$/VOUT is less than VIN/VBATT, and BUCK_off is de-asserted, the M1 tub is switched to VIN, and Buck 900 is operable in current source mode.

Figure 9B:
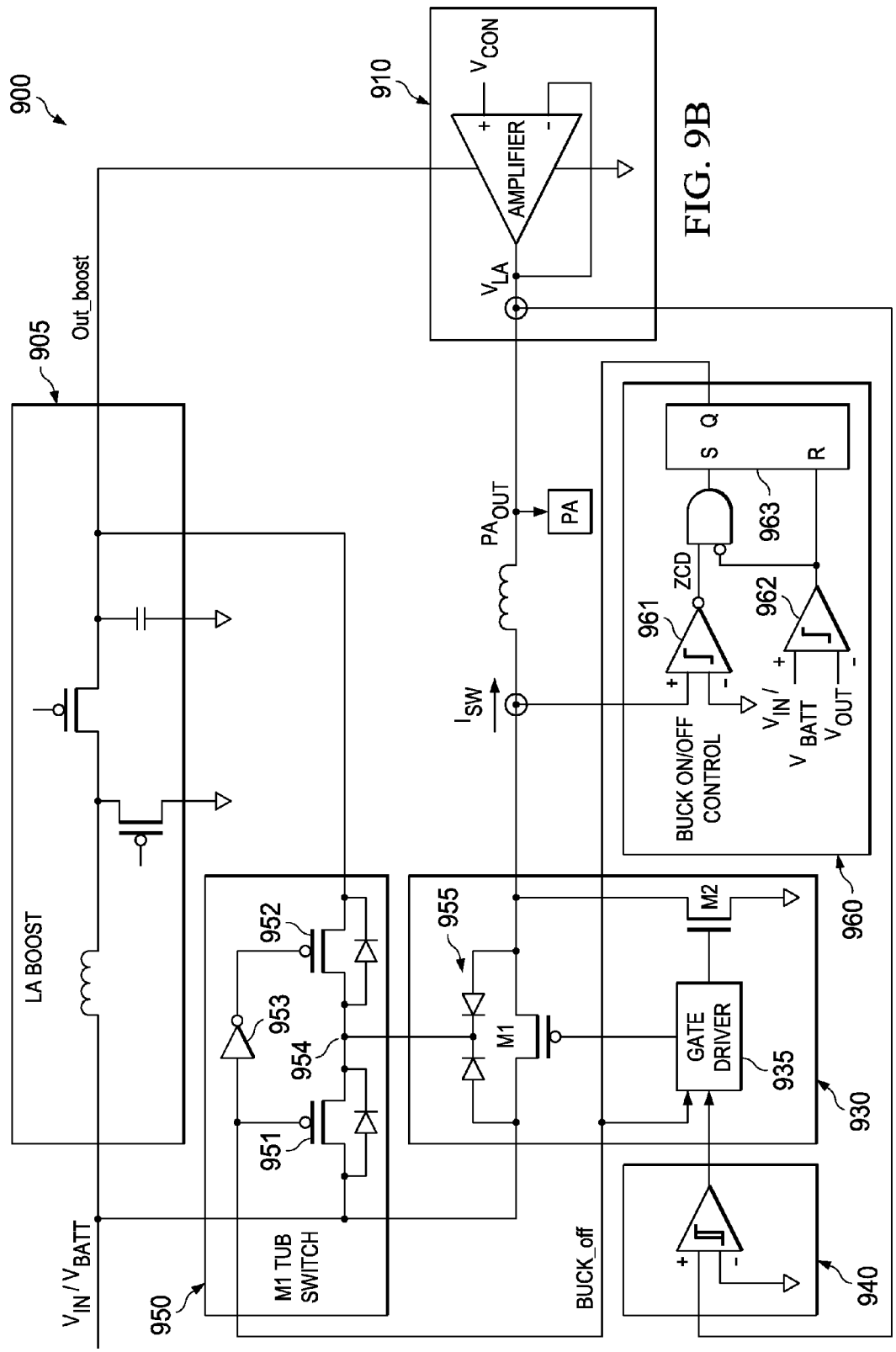

Referring in particular to FIG. 9B, Buck on/off control 960 includes a ZCD comparator 961 gated by a VIN/VOUT (VBATT/$PA_{OUT}$) comparator 962, providing SR inputs to an SR latch 963. Buck on/off control 960 senses ZCD for inductor current $I_{SW}$ (ZCD comparator 961), and asserts BUCK_off (Q output from SR latch 963) to buck gate driver 935, and to tub switching circuit 950.

Tub-switching circuit 950 is configured to control tub-switching for the main PMOS power switch M1. It includes tub PMOS switches 951 and 952, and an inverter 953. Tub PMOS switches 951/952 are series-coupled between OUT_boost from LA boost supply 905, and VIN/VBATT, and controlled by BUCK_off (from Buck on/off control 960) and inverter 953. Tub switches 951/952 control M1 body diodes 955 through a tub switching node 954.

In response to $PA_{OUT}$/VOUT exceeding VIN/VBATT, to avoid negative buck inductor current, SMAL regulator 900 implements dynamic buck turn-off, including M1 tub-switching. Gate driver 935 switches off the M1 channel, and M1 tub switching is provided by M1 tub switching circuit 950 controlled by BUCK_off from Buck on/off control 960.

In response to a buck turn-off condition signaled by Buck on-on/off control 960 asserting BUCK_off, M1 tub switching circuit 950 switches the M1 tub to OUT_boost (from boost 905). Asserting BUCK_off turns PMOS tub switch 951 off and turns PMOS tub switch 952 on (through inverter 953), switching the M1 tub to OUT_boost (through tub switching node 954). OUT-boost will always be higher than VOUT. Tub-switching switching is implemented with non-overlap timing control (clamped by OUT_boost) to avoid shoot-through current between the tub switches 951/952.

FIGS. 10A/10B illustrate a SMAL regulator 1000 with a linear amplifier 1010 in parallel with a Buck converter 1030. LA 1010 is AC-coupled through a coupling capacitor $C_{AC}$ to the $PA_{OUT}$ supply node. As described above in connection with FIG. 4, SMAL regulator 1000 can operate LA 1010 with boost functionality so long as the signal peak-to-peak amplitude is less than the supply voltage (with appropriate headroom). That is, the design constraints at the LA are that both $V_{PP}$, and $V_{PA-DC}$ (average $V_{PA}$ output voltage) are less than the LA supply voltage by some headroom. Thus, $V_{PA-PK}$ can be greater than the supply voltage as long as the $V_{PP}$ and $V_{PA-DC}$ constraints are observed.

Dynamic buck turn-off includes M1 tub switching circuit 1050, and a Buck on/off control unit 1060. When buck inductor current turns negative, buck on/off control unit 1060 asserts BUCK_off to gate driver 1035 and M1 tub switching circuit 1050, controlling M1 channel turn-off and M1 tub switching. In particular, in response to BUCK_off, M1 tub switching circuit 1050 implements a tub-switching control mechanism to dynamically switch the M1 tub to the higher of VIN/VBATT and $PA_{OUT}$/VOUT when the buck inductor current turns negative. That is, for this embodiment, a boost voltage greater than VIN is not available, so tub switching uses the higher of VIN/VBATT and $PA_{OUT}$/VOUT to switch the M1 tub when inductor current turns negative. When output voltage $PA_{OUT}$/VOUT is less than VIN/VBATT, and BUCK_off is de-asserted, the M1 tub is switched to VIN, and Buck 900 is operable in current source mode.

Figure 10B:
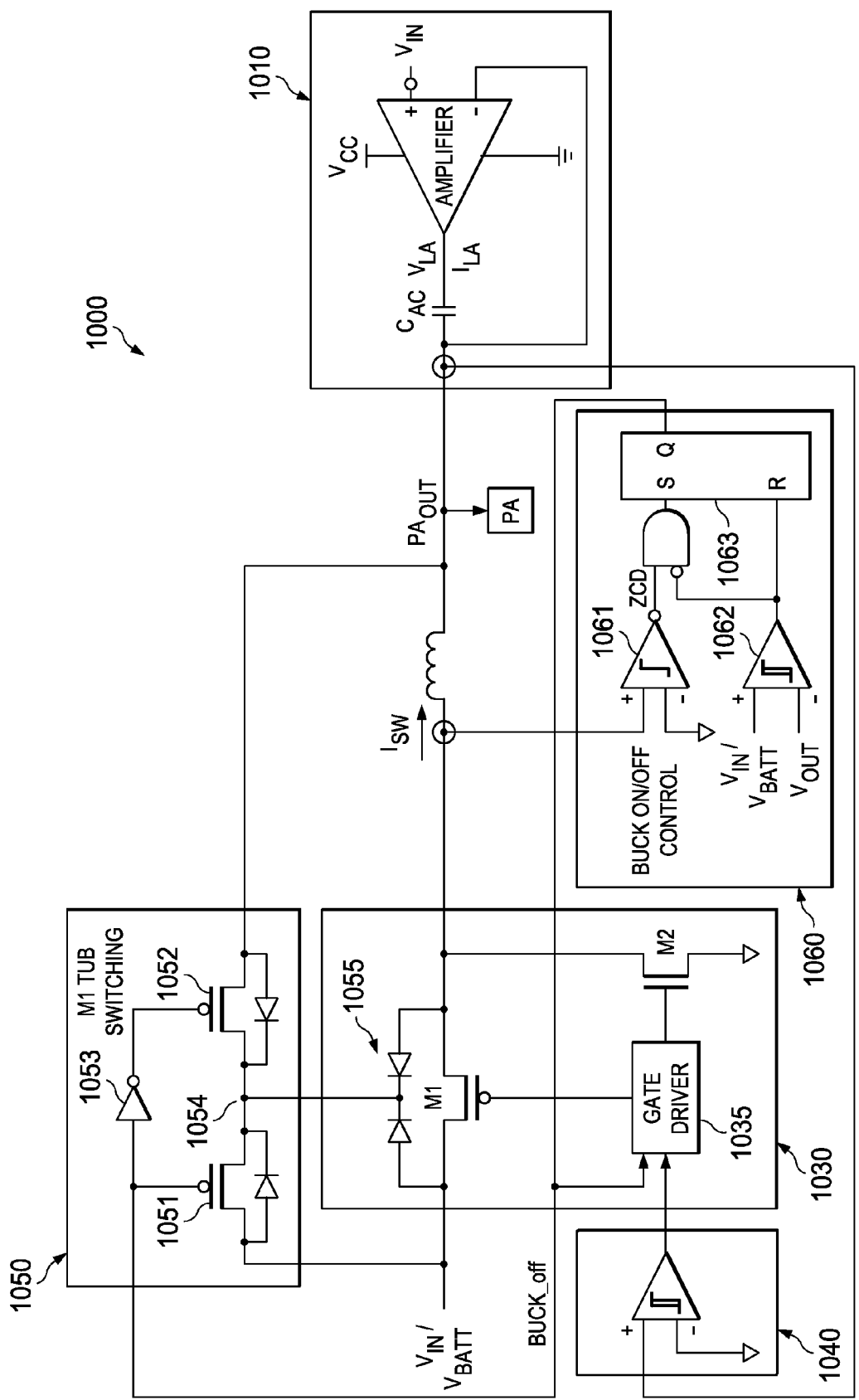

Referring in particular to FIG. 10B, Buck on/off control 1060 includes a ZCD comparator 1061 gated by a VIN/VOUT (VBATT/$PA_{OUT}$) comparator 1062, providing SR inputs to an SR latch 1063. Buck on/off control 1060 senses ZCD for inductor current $I_{SW}$ (ZCD comparator 1061), and asserts BUCK_off (Q output from SR latch 963) to buck gate driver 1035, and to tub switching circuit 1050.

Tub-switching circuit 1050 is configured to control tub-switching for the main PMOS power switch M1. It includes tub PMOS switches 1051 and 1052, and an inverter 1053. Tub PMOS switches 1051/1052 are series-coupled between OUT_boost from LA boost supply 1005, and VIN/VBATT, and controlled by BUCK_off (from Buck on/off control 1060) and inverter 1053. Tub switches 1051/1052 control M1 body diodes 1055 through a tub switching node 1054.

In response to $PA_{OUT}$/VOUT exceeding VIN/VBATT, to avoid negative buck inductor current, SMAL regulator 1000 implements dynamic buck turn-off, including M1 tub-switching. Gate driver 1035 switches off the M1 channel, and M1 tub switching is provided by M1 tub switching circuit 1050 controlled by BUCK_off from Buck on/off control 1060.

In response to a buck turn-off condition signaled by Buck on-on/off control 1060 asserting BUCK_off, M1 tub switching circuit 950 switches the M1 tub to OUT_boost (from boost 905). Asserting BUCK_off turns PMOS tub switch 1051 off and turns PMOS tub switch 1052 on (through inverter 1053), switching the M1 tub to OUT_boost (through tub switching node 1054). OUT-boost will always be higher than VOUT. Tub-switching switching is implemented with overlap timing control to conduct negative inductor current $I_{SW}$ for sufficient time to avoid overcharging the buck switching node.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A power supply circuit with a switched mode assisted linear amplifier architecture with an amplifier, and a buck switched mode converter configured for operation as a current source with a buck inductor, the power supply circuit operable to receive an input voltage VIN, and supply a regulated output voltage VOUT, and associated output current to a dynamic load, comprising:
an amplifier circuit and a buck switched mode converter (buck converter) circuit coupled in parallel at a supply node coupled to the load, the buck converter configured to couple to the supply node through the buck inductor;
the amplifier circuit configured to set load voltage VOUT;
the buck converter configured for operation as a current source supplying a buck inductor current that is a controlled portion of the output current;
the buck converter including a PMOS power switching transistor M1, with an M1 body diode, coupled between VIN and the buck inductor, with switching controlled by M1 gate driver circuitry including turning M1 off during buck turn-off conditions;
buck turn-off circuitry operable during buck turn-off conditions to switch off the M1 channel, and switch the M1 body diode to the higher of VIN and a second voltage, including
buck on/off circuitry configured to provide a BUCK_off signal that is asserted when zero buck inductor current is detected, including:
zero crossing detector (ZCD) circuitry configured to detect when buck inductor current is zero; and
VOUT detect circuitry configured to detect when VOUT is greater that VIN;
such that BUCK_off is asserted when buck inductor current is zero and VOUT is greater than VIN;
tub switching circuitry responsive to BUCK_off asserted by the ZCD circuitry to switch the M1 body diode to the higher of VIN and the second voltage.

2. The circuit of claim 1, wherein the amplifier circuit is DC-coupled to the supply node, and:
further comprising a boost supply circuit configured to supply to the amplifier circuit a boost supply voltage OUT_boost that is greater than VIN; and
wherein the tub switching circuitry is operable during buck turn-off conditions to switch the M1 body diode to OUT_boost as the second voltage.

3. The circuit of claim 2, wherein the tub switching circuitry comprises:
first and second PMOS tub switching transistors (switches) series-connected between OUT_boost and VIN, with the first tub switch drain connected to VIN, and the second tub switch source connected to OUT_boost and with a tub-switching node between the first and second tub switches connected to the M1 body diode;
the first tub switch controlled by BUCK_off, and the second tub switching transistor controlled by an inverted BUCK_off;
such that, when BUCK_off is asserted, signaling zero buck inductor current, the M1 body diode is switched to OUT_boost.

4. The circuit of claim 3, wherein the first and second switches are switched with non-overlap timing to avoid shoot-through current.

5. The circuit of claim 1:
wherein the amplifier circuit is AC-coupled to the supply node and supplied by an amplifier supply voltage, and is configured to supply an output voltage VOUT with both peak-to-peak and average voltage less than the amplifier supply voltage, such that the amplifier circuit is operable with boost functionality in which VOUT is greater than VIN; and
wherein the buck turn-off circuitry is operable during buck turn-off conditions to switch the M1 body diode to the higher of VIN and VOUT as the second voltage.

6. The circuit of claim 5, wherein the tub switching circuitry comprises:
first and second PMOS tub switching transistors (switches) series-connected between VOUT and VIN, with the first tub switch drain connected to VIN, and the second tub switch drain connected to VOUT, and with a tub-switching node between the first and second tub switches (sources) connected to the M1 body diode;

the first tub switch controlled by BUCK_off, and the second tub switching transistor controlled by an inverted BUCK_off;

such that, when BUCK_off is asserted, signaling zero buck inductor current, the M1 body diode is switched to the higher of VOUT and VIN.

7. The circuit of claim 6, with wherein the first and second switches are switched with overlap timing to conduct sufficient negative buck inductor current to prevent overvoltage at the buck switching node.

8. A power module with a switched mode assisted linear (SMAL) amplifier architecture, operable to receive an input voltage VIN, and supply a regulated output voltage VOUT, and associated output current to a dynamic load, comprising:

a SMAL regulator including an amplifier circuit and a buck switched mode converter (buck converter) circuit coupled in parallel at a supply node coupled to the load;

the amplifier circuit configured to set load voltage VOUT; and the buck converter circuit configured to couple to the supply node through a buck inductor, and configured for operation as a current source supplying a buck inductor current that is a controlled portion of the output current;

the buck converter circuit including:
a PMOS power switching transistor M1, with an M1 body diode, coupled between VIN and the buck inductor;

M1 gate driver circuitry controlling M1 switching, including turning M1 off during buck turn-off conditions; and buck turn-off circuitry operable during buck turn-off conditions to switch off the M1 channel, and switch the M1 body diode to the higher of VIN and a second voltage, including
buck on/off circuitry configured to provide a BUCK_off signal that is asserted when zero buck inductor current is detected, including:
zero crossing detector (ZCD) circuitry configured to detect when buck inductor current is zero; and
VOUT detect circuitry configured to detect when VOUT is greater that VIN;
such that BUCK_off is asserted when buck inductor current is zero and VOUT is greater than VIN; and
tub switching circuitry responsive to BUCK_off asserted by the ZCD circuitry to switch the M1 body diode to the higher of VIN and the second voltage.

9. The module of claim 8, wherein the amplifier circuit is DC-coupled to the supply node, and:

further comprising a boost supply circuit configured to supply to the amplifier circuit a boost supply voltage OUT_boost that is greater than VIN; and wherein the tub switching circuitry is operable during buck turn-off conditions to switch the M1 body diode to OUT_boost as the second voltage.

10. The module of claim 9, wherein the tub switching circuitry comprises:

first and second PMOS tub switching transistors (switches) series-connected between OUT_boost and VIN, with the first tub switch drain connected to VIN, and the second tub switch source connected to OUT_boost, and with a tub-switching node between the first and second tub switches connected to the M1 body diode;

the first tub switch controlled by BUCK_off, and the second tub switching transistor controlled by an inverted BUCK_off;

such that, when BUCK_off is asserted, signaling zero buck inductor current, the M1 body diode is switched to OUT_boost.

11. The module of claim 10, wherein the first and second switches are switched with non-overlap timing to avoid shoot-through current.

12. The module of claim 8:

wherein the amplifier circuit is AC-coupled to the supply node and supplied by an amplifier supply voltage OUT_boost, and is configured to supply an output voltage VOUT with both peak-to-peak and average voltage less than the amplifier supply voltage, such that the amplifier circuit is operable with boost functionality in which VOUT is greater than VIN; and wherein the tub switching circuitry is operable during buck turn-off conditions to switch the M1 body diode to the higher of VIN and VOUT as the second voltage.

13. The module of claim 12, wherein the tub switching circuitry comprises:

first and second PMOS tub switching transistors (switches) series-connected between VOUT and VIN, with the first tub switch drain connected to VIN, and the second tub switch drain connected to VOUT, and with a tub-switching node between the first and second tub switches (sources) connected to the M1 body diode;

the first tub switch controlled by BUCK_off, and the second tub switching transistor controlled by an inverted BUCK_off;

such that, when BUCK_off is asserted, signaling zero buck inductor current, the M1 body diode is switched to the higher of VOUT and VIN.

14. The module of claim 13, with wherein the first and second switches are switched with overlap timing to conduct sufficient negative buck inductor current to prevent overvoltage at the buck switching node.

15. A method of supplying a regulated output voltage VOUT, and associated output current, to a dynamic load with a switched mode assisted linear amplifier architecture including an amplifier and a buck switched mode converter (buck converter) coupled in parallel at a supply node, the buck converter configured for operation as a current source with a buck inductor, and including a PMOS power switching transistor M1, with an M1 body diode, coupled between a source of input power VIN and the buck inductor, the method including turning M1 off during buck turn-off conditions, comprising:

generating a BUCK_off signal that is asserted when zero buck inductor current is detected, including:
detecting when buck inductor current is zero;
detecting when VOUT is greater that VIN; and
asserting BUCK_off when buck inductor current is zero and VOUT is greater than VIN;
switching, in response to asserting BUCK_off, the M1 body diode to the higher of VIN and a second voltage.

16. The method of claim 15:

wherein the amplifier circuit is DC-coupled to the supply node, and is operable with a boost supply circuit configured to supply to the amplifier circuit a boost supply voltage OUT_boost that is greater than VIN; and wherein, during buck turn-off conditions, the M1 body diode is switched to OUT_boost as the second voltage.

17. The method of claim 16, wherein the M1 body diode is switched with non-overlap timing to avoid shoot-through current.

18. The method of claim 16:

wherein the amplifier circuit is AC-coupled to the supply node and supplied by an amplifier supply voltage, and is configured to supply an output voltage VOUT with both peak-to-peak and average voltage less than the amplifier supply voltage, such that the amplifier circuit is operable with boost functionality in which VOUT is greater than VIN; and wherein, during buck turn-off conditions, the M1 body diode is switched to the higher of VIN and VOUT as the second voltage.

19. The method of claim 18, wherein the M1 body diode is switched with overlap timing to conduct sufficient negative buck inductor current to prevent overvoltage at the buck switching node.

* * * * *